(12) United States Patent
Sun et al.

(10) Patent No.: US 11,620,953 B2
(45) Date of Patent: Apr. 4, 2023

(54) DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Kaipeng Sun, Beijing (CN); Yue Long, Beijing (CN); Feng Wei, Beijing (CN); Hongjun Zhou, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 105 days.

(21) Appl. No.: 17/419,814

(22) PCT Filed: Sep. 21, 2020

(86) PCT No.: PCT/CN2020/116488
§ 371 (c)(1),
(2) Date: Jun. 30, 2021

(87) PCT Pub. No.: WO2022/056907
PCT Pub. Date: Mar. 24, 2022

(65) Prior Publication Data
US 2022/0319438 A1    Oct. 6, 2022

(51) Int. Cl.
*G09G 3/3275*    (2016.01)
(52) U.S. Cl.
CPC ... *G09G 3/3275* (2013.01); *G09G 2300/0426* (2013.01); *G09G 2300/0439* (2013.01)

(58) Field of Classification Search
CPC ......... G09G 3/3275; G09G 2300/0426; G09G 2300/0439; G09G 2300/0861; G09G 3/3233; G09G 2300/0819; G09G 2310/0251; H01L 27/00; H01L 27/32
See application file for complete search history.

(56) References Cited

U.S. PATENT DOCUMENTS

| 11,054,686 B2* | 7/2021 | Fu .......................... G02F 1/292 |
| 11,514,859 B2* | 11/2022 | Jang ..................... G09G 3/3266 |
| 2018/0151118 A1* | 5/2018 | Chung ................ H01L 27/3262 |

(Continued)

*Primary Examiner* — Ibrahim A Khan
(74) *Attorney, Agent, or Firm* — Houtteman Law LLC

(57) ABSTRACT

The present disclosure provides a display substrate and a display device. The display substrate includes: a base; multiple pixel units arranged in multiple rows along a first direction and multiple columns along a second direction and arranged on the base, and each pixel unit includes multiple sub-pixels, each sub-pixel includes a pixel circuit; an active semiconductor layer including a channel region, a source doping region and a drain doping region of each transistor in each pixel circuit, the pixel circuit includes a driving transistor, a data writing transistor, a storage capacitor, a threshold compensation transistor, a first reset transistor, a light-emitting device; a first light-blocking pattern arranged on a side of the active semiconductor layer away from the base, an orthographic projection of the first light-blocking pattern on the base covers orthographic projections of channel regions of the first reset transistor and the threshold compensation transistor on the base.

20 Claims, 10 Drawing Sheets

(56) References Cited

U.S. PATENT DOCUMENTS

| | | | |
|---|---|---|---|
| 2018/0151650 A1* | 5/2018 | Ha | H01L 29/78696 |
| 2019/0325186 A1* | 10/2019 | Gao | G06F 3/04166 |
| 2020/0111858 A1* | 4/2020 | Lee | H01L 51/5221 |
| 2020/0365089 A1* | 11/2020 | Wang | G09G 3/3266 |
| 2021/0027719 A1* | 1/2021 | Cho | G09G 3/3258 |
| 2021/0217985 A1* | 7/2021 | Sakai | H05B 33/26 |
| 2021/0249499 A1* | 8/2021 | Jeon | H01L 27/3248 |
| 2021/0399022 A1* | 12/2021 | Park | H01L 25/167 |
| 2022/0037415 A1* | 2/2022 | Lin | H01L 51/56 |
| 2022/0173160 A1* | 6/2022 | Pak | H01L 29/78633 |
| 2022/0293707 A1* | 9/2022 | Zhou | H01L 27/3276 |
| 2022/0328600 A1* | 10/2022 | Dong | H01L 27/3218 |

\* cited by examiner

DISPLAY SUBSTRATE AND DISPLAY DEVICE

TECHNICAL FIELD

The present disclosure relates to the field of display technology, and particularly relates to a display substrate and a display device.

BACKGROUND

With the development of organic light emitting diode display technologies, such as Active Matrix Organic Light Emitting Diode (AMOLED) display technologies, the requirements of people on display effects are higher and higher. Therefore, it is a critical technical problem to provide a display device with better performance.

SUMMARY

The present disclosure is directed to solve at least one of problems of the related art, and provides a display substrate and a display device.

In a first aspect, an embodiment of the present disclosure provides a display substrate, which includes:

a base;

a plurality of pixel units, which are arranged in a plurality of rows along a first direction and a plurality of columns along a second direction and are arranged on the base, and each of the pixel units includes a plurality of sub-pixels; each of the sub-pixels includes a pixel circuit;

an active semiconductor layer, which includes a channel region, a source doping region and a drain doping region of each of transistors in each pixel circuit, the pixel circuit at least includes a driving transistor, a data writing transistor, a storage capacitor, a threshold compensation transistor, a first reset transistor and a light-emitting device; and a first light-blocking pattern arranged on a side of the active semiconductor layer away from the base, and an orthographic projection of the first light-blocking pattern on the base covers orthographic projections of channel regions of the first reset transistor and the threshold compensation transistor on the base.

In some implementations, each pixel circuit further includes a second reset transistor, a first light emitting control transistor, and a second light emitting control transistor;

for the sub-pixels located in a same row, the first reset transistor and the second reset transistor in each pixel circuit are located substantially on a straight line extending in the first direction; the first light emitting control transistor and the second light emitting control transistor in each pixel circuit are located substantially on a straight line extending in the first direction, and the threshold compensation transistor and the data writing transistor in each pixel circuit are located substantially on a straight line extending in the first direction;

for the sub-pixels located in a same column, the second reset transistor, the second light emitting control transistor, and the threshold compensation transistor in each pixel circuit are located substantially on a straight line extending in the second direction; the first reset transistor, the first light emitting control transistor, and the data writing transistor in each pixel circuit are located substantially on a straight line extending in the second direction.

In some implementations, a control electrode of the driving transistor includes a first side and a second side oppositely arranged along the second direction; for the pixel circuit of each of the sub-pixels, the first reset transistor, the second reset transistor, the first light emitting control transistor, and the second light emitting control transistor are located on the first side; the threshold compensation transistor and the data write transistor are located on the second side.

In some implementations, the light-emitting device in each pixel circuit includes a first electrode, a light-emitting layer, and a second electrode, which are arranged in this order on a side of the transistors in each pixel circuit away from the base; the first light-blocking pattern and the first electrode of the light-emitting device are arranged in a same layer and are made of a same material.

In some implementations, the plurality of sub-pixels in each pixel unit include a first color sub-pixel, a second color sub-pixel, and a third color sub-pixel; the first light-blocking pattern includes a first light-blocking portion, a second light-blocking portion, a third light-blocking portion, a fourth light-blocking portion, a fifth light-blocking portion and a sixth light-blocking portion in each sub-pixel;

an orthographic projection of the first light-blocking portion on the base covers an orthographic projection of the channel region of the first reset transistor in the first color sub-pixel on the base; an orthographic projection of the second light-blocking portion on the base covers an orthographic projection of the channel region of the threshold compensation transistor in the first color sub-pixel on the base; an orthographic projection of the third light-blocking portion on the base covers an orthographic projection of the channel region of the first reset transistor in the second color sub-pixel on the base; an orthographic projection of the fourth light-blocking portion on the base covers an orthographic projection of the channel region of the threshold compensation transistor in the second color sub-pixel on the base; an orthographic projection of the fifth light-blocking portion on the base covers an orthographic projection of the channel region of the first reset transistor in the third color sub-pixel on the base; and an orthographic projection of the sixth light-blocking portion on the base covers an orthographic projection of the channel region of the threshold compensation transistor in the third color sub-pixel on the base.

In some implementations, for the pixel units located in a same column, first electrodes of light emitting devices in pixel circuits of second color sub-pixels are substantially located on a straight line extending in the second direction; first electrodes of light emitting devices in pixel circuits of first color sub-pixels and second color sub-pixels are located substantially on a straight line extending in the second direction;

the first electrode of the light-emitting device of the third color sub-pixel in the pixel unit in $i^{th}$ row and $j^{th}$ column is in an integral structure with the second light-blocking portion of the pixel unit, and the first light-blocking portion and the third light-blocking portion in the pixel unit in $i^{th}$ row and $(j+1)^{th}$ column;

the first electrode of the light-emitting device of the second color sub-pixel in the pixel unit in $i^{th}$ row and $j^{th}$ column is in an integral structure with the fourth light-blocking portion and the sixth light-blocking portion of the pixel unit, and the fifth light-blocking portion in the pixel unit in $i^{th}$ row and $(j+1)^{th}$ column; where i ranges from 1 to N, and N is the number of the pixel units in each column; j ranges from 1 to M, and M is the number of the pixel units in each row.

In some implementations, the display substrate further includes:

a gate insulation layer arranged on a side of the active semiconductor layer away from the base;

a first conductive layer arranged on a side of the gate insulation layer away from the active semiconductor layer; the first conductive layer includes a second electrode plate of the storage capacitor, a scan signal line extending in the first direction, a reset control signal line extending in the first direction, a light emitting control signal line extending in the first direction, and control electrodes of the driving transistor, the data writing transistor, the threshold compensation transistor, the first light emitting control transistor, the second light emitting control transistor, the first reset transistor, the second reset transistor, and the control electrode of the driving transistor is multiplexed as the second electrode plate of the storage capacitor;

a first insulation layer arranged on a side of the first conductive layer away from the gate insulation layer;

a second conductive layer arranged on a side of the first insulation layer away from the first conductive layer; the second conductive layer includes a reset power signal line extending in the first direction and a first electrode plate of the storage capacitor;

a second insulation layer arranged on a side of the second conductive layer away from the first insulation layer;

a source-drain metal layer arranged on a side of the second insulation layer away from the second conductive layer; the source-drain metal layer includes a power signal line extending along the second direction, a data line extending along the second direction, a first connection portion, a second connection portion and a third connection portion;

a planarization layer arranged between the source-drain metal layer and the first electrode of the light-emitting device;

the first connection portion is configured to couple a second electrode of the threshold compensation transistor to the control electrode of the driving transistor, the second connection portion is configured to couple the reset power signal line to a first electrode of the second reset transistor, and the third connection portion is configured to couple the first electrode of the light emitting device to a second electrode of the second light emitting control transistor;

the third connection portion includes a first portion electrically coupled to the second electrode of the second light emitting control transistor through a via penetrating through the gate insulation layer, the first insulation layer and the second insulation layer, and a second portion electrically coupled to the first electrode of the light emitting device through a via penetrating through the planarization layer.

In some implementations, the second conductive layer further includes a second light-blocking pattern provided in each of the sub-pixels; an orthographic projection of the second light-blocking pattern in each sub-pixel on the base covers an orthographic projection of the channel region of the threshold compensation transistor of the pixel circuit in the sub-pixel, and the second light-blocking pattern is electrically coupled to a first power signal line.

In some implementations, the first power signal line to which the second light-blocking pattern is coupled is one of a plurality of first power signal lines closest to the second light-blocking pattern in the first direction.

In some implementations, the display substrate further includes:

a gate insulation layer arranged on a side of the active semiconductor layer away from the base;

a first conductive layer arranged on a side of the gate insulation layer away from the active semiconductor layer; the first conductive layer includes a second electrode plate of the storage capacitor, a scan signal line extending in the first direction, a reset control signal line extending in the first direction, a light emitting control signal line extending in the first direction, and control electrodes of the driving transistor, the data writing transistor, the threshold compensation transistor, the first light emitting control transistor, the second light emitting control transistor, the first reset transistor, and the second reset transistor, and the control electrode of the driving transistor is multiplexed as the second electrode plate of the storage capacitor;

a first insulation layer arranged on a side of the first conductive layer away from the gate insulation layer;

a second conductive layer arranged on a side of the first insulation layer away from the first conductive layer; the second conductive layer includes a reset power signal line extending in the first direction and a first electrode plate of the storage capacitor;

a second insulation layer arranged on a side of the second conductive layer away from the first insulation layer;

a source-drain metal layer arranged on a side of the second insulation layer away from the second conductive layer; the source-drain metal layer includes a power signal line extending in the second direction, a data line extending in the second direction, and the first light-blocking pattern.

In some implementations, the first light-blocking pattern includes a seventh light-blocking portion and an eighth light-blocking portion in each sub-pixel; an orthographic projection of the seventh light-blocking portion on the base covers an orthographic projection of the channel region of the first reset transistor of the pixel circuit in the sub-pixel where the seventh light-blocking portion is located on the base; an orthographic projection of the eighth light-blocking portion on the base covers an orthographic projection of the channel region of the threshold compensation transistor of the pixel circuit in the sub-pixel where the eighth light-blocking portion is located on the base;

the seventh light-blocking portion and the power signal line coupled to the sub-pixel where the seventh light-blocking portion is located are of an integral structure.

In some implementations, the display substrate further includes:

a planarization layer arranged between the source-drain metal layer and the first electrode of the light-emitting device;

the source-drain metal layer further includes: a first connection portion, a second connection portion, and a third connection portion;

the first connection portion is configured to couple a second electrode of the threshold compensation transistor to the control electrode of the driving transistor, the second connection portion is configured to couple the reset power signal line to a first electrode of the second reset transistor, and the third connection portion is configured to couple the first electrode of the light emitting device to a second electrode of the second light emitting control transistor;

the third connection portion includes a first portion electrically coupled to the second electrode of the second light emitting control transistor through a via penetrating through the gate insulation layer, the first insulation layer and the second insulation layer, and a second portion electrically coupled to the first electrode of the light emitting device through a via penetrating through the planarization layer;

the eighth light-blocking portion and the second connection portion are of an integral structure.

In some implementations, the second conductive layer further includes a second light-blocking pattern provided in each of the sub-pixels; an orthographic projection of the second light-blocking pattern in each sub-pixel on the base covers an orthographic projection of the channel region of the threshold compensation transistor of the pixel circuit in the sub-pixel on the base, and the second light-blocking pattern is electrically coupled to the first power signal line.

In some implementations, the first power signal line to which each second light-blocking pattern is coupled is one of a plurality of first power signal lines which is closest to the second light-blocking pattern in the first direction.

In some implementations, both the first reset transistor and the threshold compensation transistor are double-gate transistors.

In a second aspect, an embodiment of the present disclosure provides a display device, which includes the display substrate described above.

DRAWINGS

DETAILED DESCRIPTION

Figure 1:
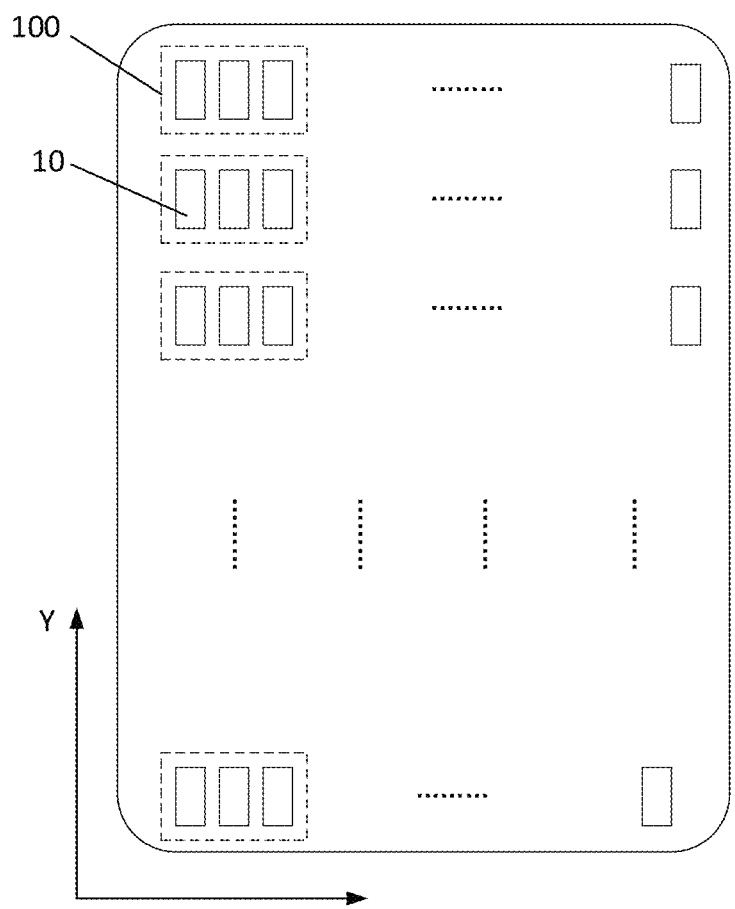
FIG. 1 is a schematic structural diagram of an exemplary display substrate.

In order to make the technical solutions of the present disclosure better understood, the present disclosure is further described in detail with reference to the accompanying drawings and the specific implementations below.

Unless defined otherwise, technical or scientific terms used herein shall have the ordinary meaning as understood by one of ordinary skill in the art to which the present disclosure belongs. The use of "first", "second", and the like in the present disclosure is not intended to indicate any order, quantity, or importance, but rather is used to distinguish one element from another. Also, the use of the terms "a", "an" or "the" and similar referents do not denote a limitation of quantity, but rather denote the presence of at least one. The word "include", "comprise", or the like, means that the element or item preceding the word includes the element or item listed after the word and its equivalent, but does not exclude other elements or items. The terms "coupled" or "connected" and the like are not restricted to physical or mechanical connections, but may include electrical connections, whether direct or indirect. The word "upper", "lower", "left", "right", and the like are used only to indicate relative positional relationships, and when the absolute position of the object being described is changed, the relative positional relationships may also be changed accordingly.

In a first aspect, an embodiment of the present disclosure provides a display substrate, which includes: a base, a plurality of pixel units, an active semiconductor layer and a first-blocking pattern; the pixel units are arranged on the base and arranged in an array, namely, the pixel units are arranged in a plurality of rows along a first direction and in a plurality of columns along a second direction. Each pixel unit includes a plurality of sub-pixels, and each sub-pixel includes a pixel circuit; the pixel circuit at least includes a driving transistor, a data writing transistor, a storage capacitor, a threshold compensation transistor, a first reset transistor and a light-emitting device; in the embodiment of the present disclosure, the first reset transistor is configured to initialize, in response to a reset control signal, the storage capacitor by a reset power signal; the data writing transistor is configured to write, in response to a scan signal, a data voltage signal into a first electrode of the driving transistor, and the data voltage signal is stored by the storage capacitor; the threshold compensation transistor is configured to compensate, in response to the scan signal, a threshold voltage of the driving transistor; the driving transistor is configured to control an operation of the light emitting device according to voltages of the first electrode and a control electrode thereof. Specifically, in the embodiment of the present disclosure, the active semiconductor layer includes a channel region, a source doping region and a drain doping region of each transistor in each pixel circuit, the first light-blocking pattern is disposed on a side of the active semiconductor layer away from the base, and an orthographic projection of the first light-blocking pattern on the base covers orthographic projections of the channel region of the first reset transistor and the channel region of the threshold compensation transistor on the base.

In the embodiment of the present disclosure, since the first light-blocking pattern is disposed in the display substrate, and the orthographic projection of the first light-blocking pattern on the base covers the orthographic projections of the channel regions of the first reset transistor and the threshold compensation transistor on the base, that is, the channel regions of the first reset transistor and the threshold compensation transistor are blocked by the first light-blocking pattern, the channel regions of the first reset transistor and the threshold compensation transistor T2 can be effectively prevented from being illuminated, so that switching characteristics of the first reset transistor and the threshold compensation transistor cannot be affected.

In some implementations, the base 101 in the display substrate is a flexible base, and may be specifically made of polyimide (PI). Certainly, the base 101 may be a glass base, which is made of a rigid material.

In some implementations, to prevent the influence of a leakage current of the transistor on the circuit performance, the first reset transistor and the threshold compensation transistor are designed as double-gate transistors in the embodiment of the present disclosure; and in the following description, the first reset transistor and the threshold compensation transistor being the double-gate transistors are taken as an example for illustration, but the first reset transistor and the threshold compensation transistor may also be single-gate transistors, and all of them are within the protection scope of the present disclosure.

Figure 5:
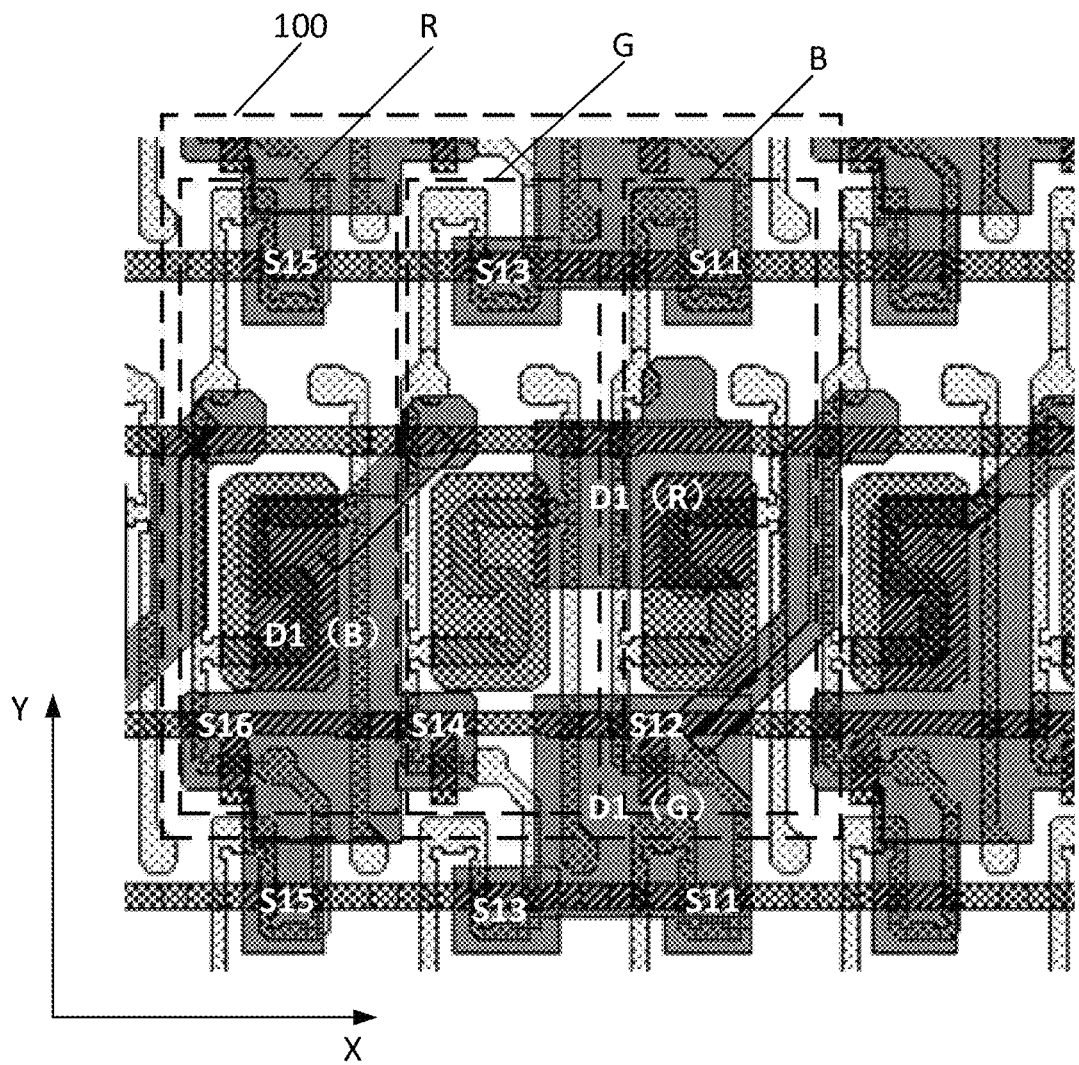
FIG. 5 is a layout of a display substrate including a first light-blocking pattern according to an embodiment of the present disclosure.

In some implementations, FIG. 5 is a layout of a display substrate including a first light-blocking pattern according to an embodiment of the present disclosure, as shown in FIG. 5, in the embodiment of the present disclosure, the first light-blocking pattern and a first electrode of the light-emitting device are disposed in a same layer and made of a same material; thus, an overall thickness of the display substrate is not increased, and the number of process steps is not increased, and a structure of the display substrate according to the embodiment of the present disclosure is described below with reference to specific examples.

Figure 2:
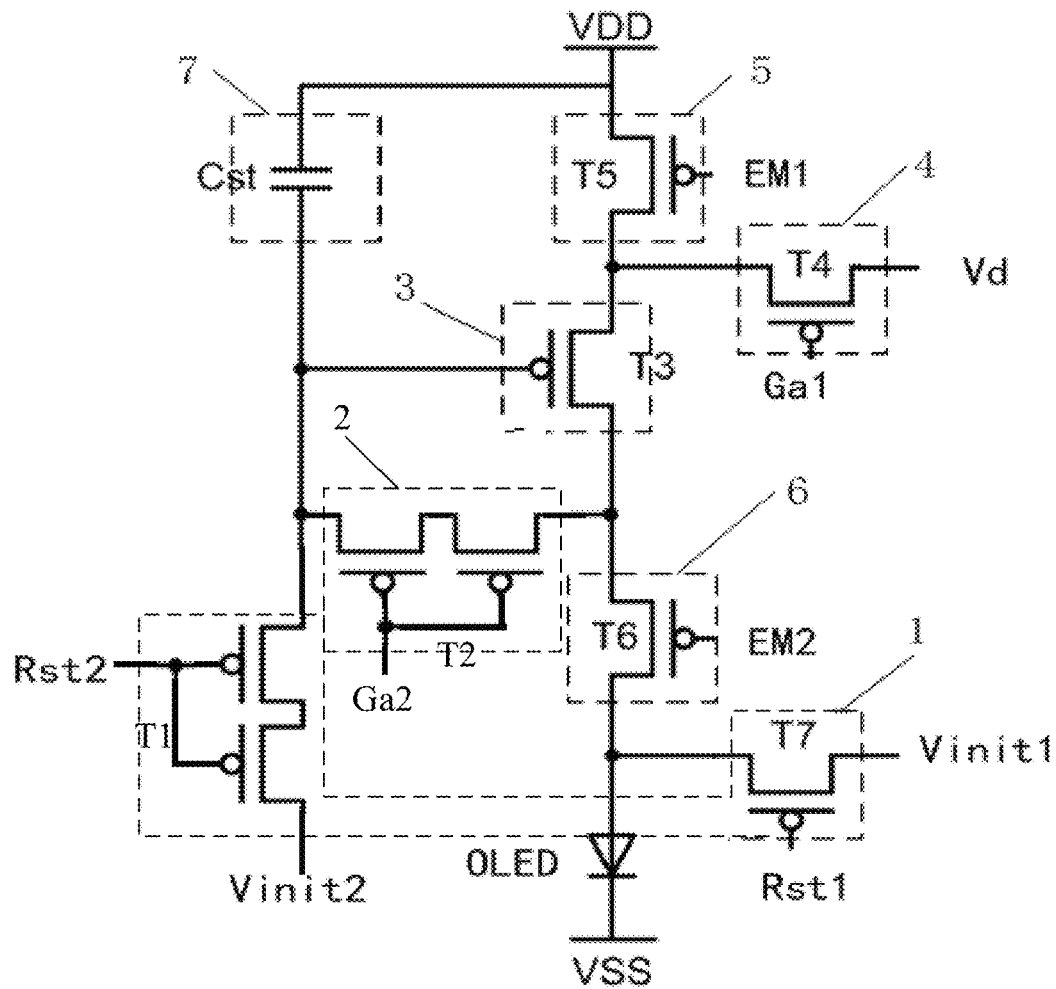
FIG. 2 is a schematic diagram of an exemplary pixel circuit.

FIG. 1 is a schematic structural diagram of an exemplary display substrate; FIG. 2 is a schematic diagram of an exemplary pixel circuit; as shown in FIGS. 1 and 2, the display substrate includes a base 101, a plurality of pixel units 100 arranged in an array are disposed on the base 101, and each pixel unit 100 includes three color sub-pixels 10, which are a first color sub-pixel, a second color sub-pixel, and a third color sub-pixel. In the embodiment of the present disclosure, a case where the first color sub-pixel is a red sub-pixel, the second color sub-pixel is a green sub-pixel, and the third color sub-pixel is a blue sub-pixel is taken as an example for illustration, but the present disclosure is not limited thereto, the colors may be interchanged. Each sub-pixel is provided with a pixel circuit. The pixel circuit in each sub-pixel may include a driving sub-circuit 3, a first light emitting control sub-circuit 5, a second light emitting control sub-circuit 6, a data writing sub-circuit 4, a storage sub-circuit 7, a threshold compensation sub-circuit 2, a reset sub-circuit 1, and a light emitting device D.

It should be noted that, in the embodiment of the present disclosure, sub-pixels 10 of three colors are included in each pixel unit 100, and the number of the sub-pixels 10 of three colors included in each pixel unit 100 is limited. For example, in each pixel unit 100, taking the first color sub-pixel being a red sub-pixel, the second color sub-pixel being a green sub-pixel, and the third color sub-pixel being a blue sub-pixel as an example, the number of red sub-pixels is two, the number of green sub-pixels and the number of blue sub-pixels are one respectively; alternatively, in each pixel unit 100, the number of the green sub-pixels is two, the number of the red sub-pixels and the number of the blue sub-pixels are one respectively; alternatively, in each pixel unit 100, the number of the blue sub-pixels is two, and the number of the red sub-pixels and the number of the green sub-pixels are one respectively. Certainly, it should be noted that, in the embodiment of the present disclosure, the number of colors of the sub-pixels 10 in each pixel unit 100 is not limited to three. For example, each pixel unit may include sub-pixels 10 of four colors, namely a red sub-pixel, a green sub-pixel, a blue sub-pixel and a white sub-pixel.

The first light emitting control sub-circuit 5 is respectively coupled with a first power terminal VDD and a first terminal of the driving sub-circuit 3 and configured to allow a current between the driving sub-circuit and the first power terminal VDD or not, and the second light emitting control sub-circuit 6 is respectively electrically coupled with a second terminal of the driving sub-circuit and a first electrode D1 of the light emitting device D and configured to allow a current between the driving sub-circuit 3 and the light emitting device D or not. The data writing sub-circuit 4 is electrically coupled to the first terminal of the driving sub-circuit 3 and is configured to write a data signal to the storage sub-circuit 7 under the control of a scan signal. The storage sub-circuit 8 is electrically coupled to a control terminal of the driving sub-circuit 3 and the first power terminal VDD, respectively, and is configured to store the data signal. The threshold compensation sub-circuit 2 is electrically coupled to the control terminal and the second terminal of the driving sub-circuit 3, respectively, and is configured to perform threshold compensation on the driving sub-circuit 3. The reset sub-circuit 1 is electrically coupled to the control terminal of the driving sub-circuit 3 and the first electrode D1 of the light emitting device D, and is configured to reset the control terminal of the driving sub-circuit 3 and the first electrode D1 of the light emitting device D under the control of a reset control signal.

With continued reference to FIG. 1, the driving sub-circuit 3 includes a driving transistor T3, the control terminal of the driving sub-circuit 3 includes a control electrode of the driving transistor T3, the first terminal of the driving sub-circuit 3 includes a first electrode of the driving transistor T3, and the second terminal of the driving sub-circuit 3 includes a second electrode of the driving transistor T3. The data writing sub-circuit 4 includes a data writing transistor T4, the storage sub-circuit 7 includes a storage capacitor Cst, the threshold compensation sub-circuit 2 includes a threshold compensation transistor T2, the first light emitting control sub-circuit 5 includes a first light emitting control transistor T5, the second light emitting control sub-circuit 6 includes a second light emitting control transistor T6, and the reset sub-circuit 1 includes a first reset transistor T1 and a second reset transistor T7, where the reset control signal includes a first sub-reset control signal and a second sub-reset control signal.

It should be noted that, according to characteristics of transistors, the transistors may be divided into N-type transistors and P-type transistors, and for the sake of clarity, the embodiment of the present disclosure adopts the transistors being P-type transistors (for example, P-type MOS transistors) to illustrate the technical solution of the present disclosure in detail, that is, in the description of the present disclosure, the driving transistor T3, the data writing transistor T4, the threshold compensation transistor T2, the first light emitting control transistor T5, the second light emitting control transistor T6, the first reset transistor T1 and the second reset transistor T7 may all be P-type transistors. However, the transistors in the embodiment of the present disclosure are not limited to P-type transistors, and one skilled in the art may also implement functions of one or more transistors in the embodiment of the present disclosure by using N-type transistors (e.g., N-type MOS transistors) according to actual needs.

In addition, the transistors used in the embodiment of the present disclosure may be thin film transistors or field effect transistors or other switching devices having the same characteristics, and the thin film transistors may include oxide semiconductor thin film transistors, amorphous silicon thin film transistors or polysilicon thin film transistors, and the like. For each transistor, it includes a first electrode, a second electrode and a control electrode; the control electrode is used as a gate of the transistor, one of the first electrode and the second electrode is used as a source of the transistor, and the other one is used as a drain electrode of the transistor; the source and the drain of the transistor may be symmetrical in structure, so that there may be no difference therebetween in physical structure. In the embodiment of the present disclosure, in order to distinguish, except for a gate serving as the control electrode, the first electrode is directly described as a source, and the second electrode is a drain, and thus the source and the drain of all or part of the transistors in the embodiment of the present disclosure may be interchanged as necessary.

With continued reference to FIG. 2, a source of the data writing transistor T4 is electrically coupled to a source of the driving transistor T3, a drain of the data writing transistor T4 is configured to be electrically coupled to a data line Vd to receive a data signal, and a gate of the data writing transistor T4 is configured to be electrically coupled to a first scan signal line Ga1 to receive the scan signal; a first electrode plate CC1 of the storage capacitor Cst is electrically coupled to the first power terminal VDD, and a second electrode plate of the storage capacitor Cst is electrically coupled to the gate of the driving transistor T3; a source of the threshold compensation transistor T2 is electrically coupled to the drain of the driving transistor T3, a drain of the threshold compensation transistor T2 is electrically coupled to the gate of the driving transistor T3, and a gate of the threshold compensation transistor T2 is configured to be electrically coupled to a second scan signal line Ga2 to receive a compensation control signal; a source of the first reset transistor T1 is configured to be electrically coupled to a first reset power terminal Vinit1 to receive a first reset signal, a drain of the first reset transistor T1 is electrically coupled to the gate of the driving transistor T3, and a gate of the first reset transistor T1 is configured to be electrically coupled to a first reset control signal line Rst1 to receive a first sub-reset control signal; a source of the second reset transistor T7 is configured to be electrically coupled to the first reset power terminal Vinit1 to receive the first reset signal, a drain of the second reset transistor T7 is electrically coupled to the first electrode D1 of the light emitting device D, and a gate of the second reset transistor T7 is configured to be electrically coupled to a second reset control signal line Rst2 to receive a second sub-reset control signal; a source of the first light emitting control transistor T5 is electrically coupled to the first power terminal VDD, a drain of the first light emitting control transistor T5 is electrically coupled to the source of the driving transistor T3, and a gate of the first light emitting control transistor T5 is configured to be electrically coupled to a first light emitting control signal line EM1 to receive a first light emitting control signal; a source of the second light emitting control transistor T6 is electrically coupled to the drain of the driving transistor T3, a drain of the second light emitting control transistor T6 is electrically coupled to the first electrode D1 of the light emitting device D, and a gate of the second light emitting control transistor T6 is configured to be electrically coupled to a second light emitting control signal line EM2 to receive a second light emitting control signal; a second electrode D3 of the light emitting device D is electrically coupled to a second power terminal VSS.

Figure 8:
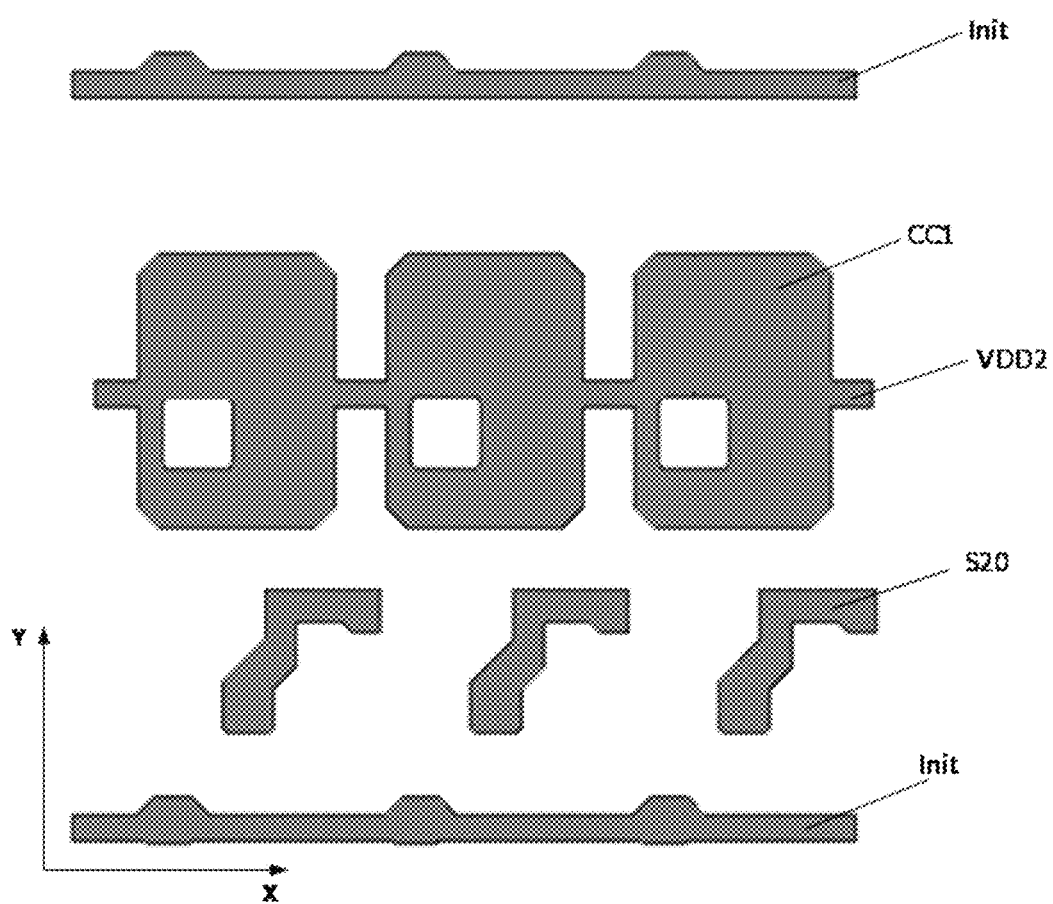
FIG. 8 is a schematic diagram of a second conductive layer of a display substrate according to an embodiment of the present disclosure.

For example, one of the first power terminal VDD and the second power terminal VSS is a high voltage terminal, and the other is a low voltage terminal. For example, in the embodiment as shown in FIG. 8, the first power terminal VDD is a voltage source for outputting a constant first voltage, which is a positive voltage; and the second power terminal VSS may be a voltage source for outputting a constant second voltage, which is a negative voltage. For example, in some implementations, the second power terminal VSS may be grounded.

With continued reference to FIG. 2, the scan signal and the compensation control signal may be the same, i.e., the gate of the data writing transistor T4 and the gate of the threshold compensation transistor T2 may be electrically coupled to a same signal line, e.g., the first scan signal line Ga1, to receive the same signal (e.g., the scan signal), and in such case, the display substrate may not be provided with the second scan signal line Ga2, reducing the number of signal lines. For another example, the gate of the data writing transistor T4 and the gate of the threshold compensation transistor T2 may be electrically coupled to different signal lines, i.e., the gate of the data writing transistor T4 is electrically coupled to the first scan signal line Ga1, the gate of the threshold compensation transistor T2 is electrically coupled to the second scan signal line Ga2, but the signals transmitted by the first scan signal line Ga1 and the second scan signal line Ga2 are the same.

It should be noted that the scan signal and the compensation control signal may be different, so that the gates of the data writing transistor T4 and the threshold compensation transistor T2 may be separately controlled, thereby improving the flexibility of controlling the pixel circuit. In the embodiment of the present disclosure, a case where both the gate of the data writing transistor T4 and the gate of the threshold compensation transistor T2 are electrically coupled to the first scan signal line Ga1 is taken as an example.

With continued reference to FIG. 2, the first light emitting control signal and the second light emitting control signal may be the same, i.e., the gate of the first light emitting control transistor T5 and the gate of the second light emitting control transistor T6 may be electrically coupled to the same signal line, e.g., the first light emitting control signal line EM1, to receive a same signal (e.g., the first light emitting control signal), in such case, the display substrate may not be provided with the second light emitting control signal line EM2, reducing the number of signal lines. For another example, the gate of the first light emitting control transistor T5 and the gate of the second light emitting control transistor T6 may be electrically coupled to different signal lines, respectively, that is, the gate of the first light emitting control transistor T5 is electrically coupled to the first light emitting control signal line EM1, the gate of the second light emitting control transistor T6 is electrically coupled to the second light emitting control signal line EM2, but the signals transmitted by the first light emitting control signal line EM1 and the second light emitting control signal line EM2 are the same.

It should be noted that, when the first light emitting control transistor T5 and the second light emitting control transistor T6 are different types of transistors, for example, the first light emitting control transistor T5 is a P-type transistor, and the second light emitting control transistor T6 is an N-type transistor, the first light emitting control signal and the second light emitting control signal may be different, which is not limited in the embodiment of the present disclosure. In the embodiment of the present disclosure, a case where both the gates of the first light emitting control transistor T5 and the second light emitting control transistor T6 are coupled to the first light emitting control line is taken as an example.

For example, the first sub-reset control signal and the second sub-reset control signal may be the same, that is, the gate of the first reset transistor T1 and the gate of the second reset transistor T7 may be electrically coupled to a same signal line, e.g., the first reset control signal line Rst1 to receive a same signal (for example, the first sub-reset control signal), and in such case, the display substrate may not be provided with the second reset control signal line Rst2, reducing the number of signal lines. For another example, the gate of the first reset transistor T1 and the gate of the second reset transistor T7 may be electrically coupled to different signal lines, respectively, that is, the gate of the first reset transistor T1 is electrically coupled to the first reset control signal line Rst1, the gate of the second reset transistor T7 is electrically coupled to the second reset control signal line Rst2, but the signals transmitted by the first reset control signal line Rst1 and the second reset control signal line Rst2 are the same. It should be noted that the first sub-reset control signal and the second sub-reset control signal may be different.

For example, in some implementations, the second sub-reset control signal may be the same as the scan signal, i.e., the gate of the second reset transistor T7 may be electrically coupled to the scan signal line Ga to receive the scan signal as the second sub-reset control signal.

For example, the source of the first reset transistor T1 and the source of the second reset transistor T7 are coupled to the first reset power terminal Vinit1 and the second reset power terminal Vinit2, respectively, and the first reset power terminal Vinit1 and the second reset power terminal Vinit2 may be direct current (DC) reference voltage terminals for outputting constant DC reference voltages. The first reset power terminal Vinit1 and the second reset power terminal Vinit2 may be the same, for example, the source of the first reset transistor T1 and the source of the second reset transistor T7 are coupled to a same reset power terminal. The first and second reset power terminals Vinit1 and Vinit2 may be high voltage terminals or low voltage terminals, as long as they can provide a first reset signal and a second reset signal to reset the gate of the driving transistor T3 and the first electrode D1 of the light emitting element, which is not limited by the present disclosure. For example, the source of the first reset transistor T1 and the source of the second reset transistor T7 may both be coupled to a reset power signal line Init.

It should be noted that, the driving sub-circuit, the data writing sub-circuit, the storage sub-circuit, the threshold compensation sub-circuit, and the reset sub-circuit in the pixel circuit shown in FIG. 2 are only schematic, and specific structures of the driving sub-circuit, the data writing sub-circuit, the storage sub-circuit, the threshold compensation sub-circuit, and the reset sub-circuit may be set according to practical application requirements, which is not specifically limited by the embodiment of the present disclosure.

It should be noted that, in the embodiment of the present disclosure, besides the 7T1C (i.e., seven transistors and one capacitor) structure shown in FIG. 2, the pixel circuit of the sub-pixel may also be a structure including other number of transistors, for example, may be a 7T2C structure, a 6T1C structure, a 6T2C structure, or a 9T2C structure, which is not limited in the embodiment of the present disclosure.

Figure 3:
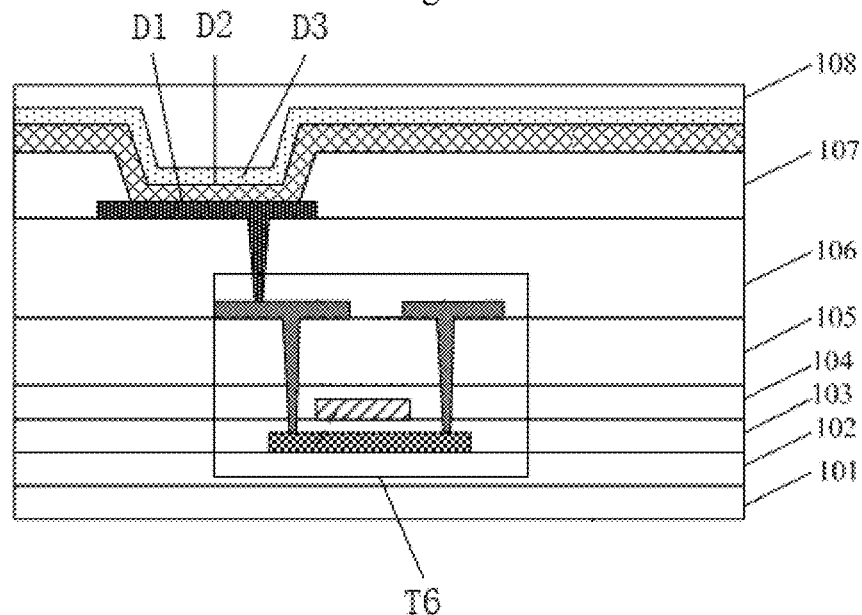
FIG. 3 is a cross-sectional view of a connection of a second light emitting control transistor with a light emitting device in an exemplary display substrate.
Figure 4:
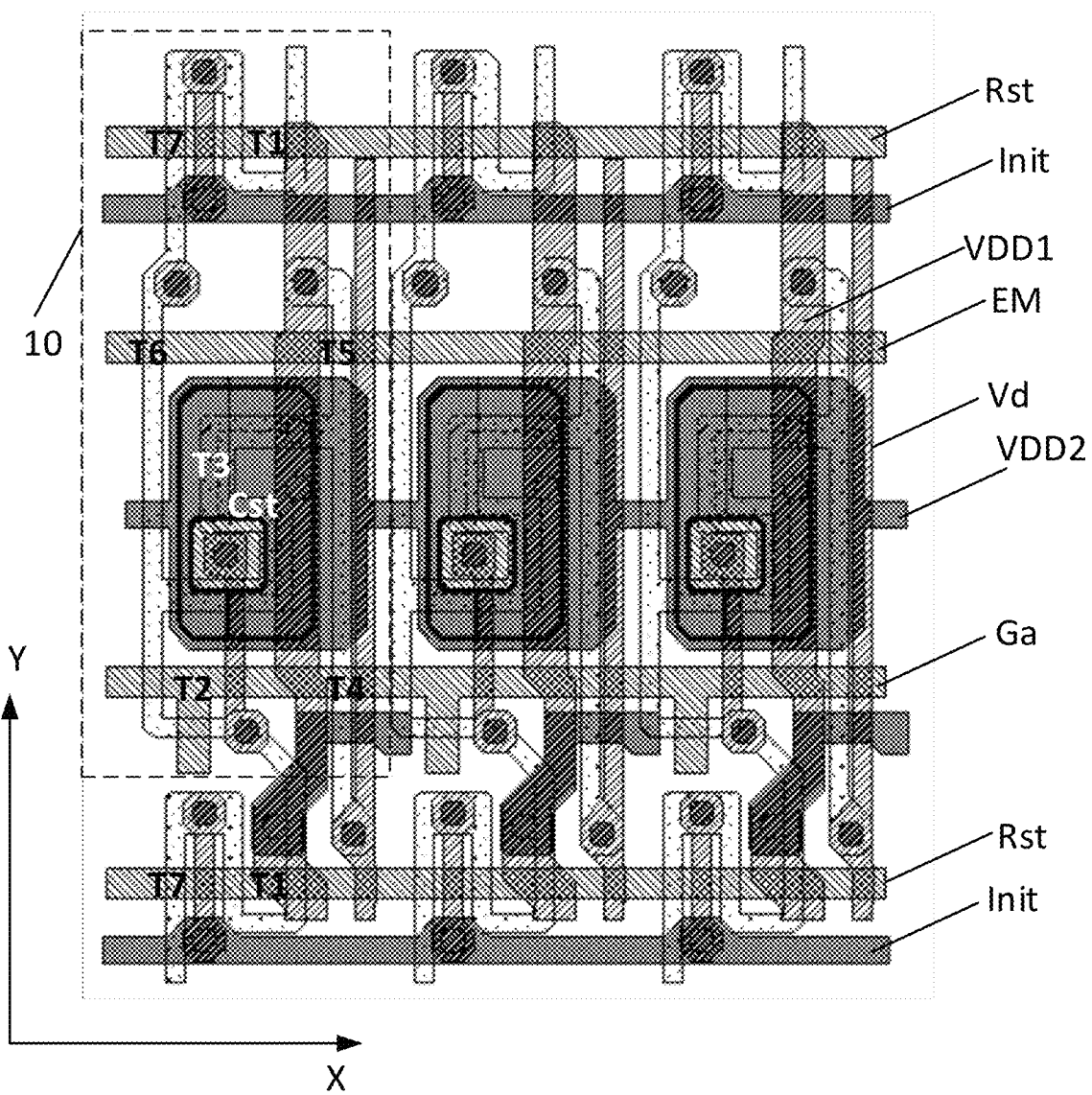
FIG. 4 is a layout of positions of transistors of a display substrate according to an embodiment of the present disclosure.

FIG. 3 is a cross-sectional view illustrating a connection between the second light emitting control transistor and the light emitting device D in an exemplary display substrate; FIG. 4 is a layout of positions of transistors of a display substrate according to an embodiment of the present disclosure; the example shown in FIG. 4 is exemplified by pixel circuits of three sub-pixels in one pixel unit 100, and the positions of the transistors of the pixel circuit included in one sub-pixel are illustrated, and the positions of the transistors included in the pixel circuit in any other sub-pixels are substantially the same as the positions of the transistors included in the present sub-pixel. As shown in FIG. 4, the pixel circuit of the sub-pixel includes the driving transistor T3, the data writing transistor T4, the threshold compensation transistor T2, the first light emitting control transistor T5, the second light emitting control transistor T6, the first and second reset transistors T1 and T7, and the storage capacitor Cst shown in FIG. 2.

Figure 6:
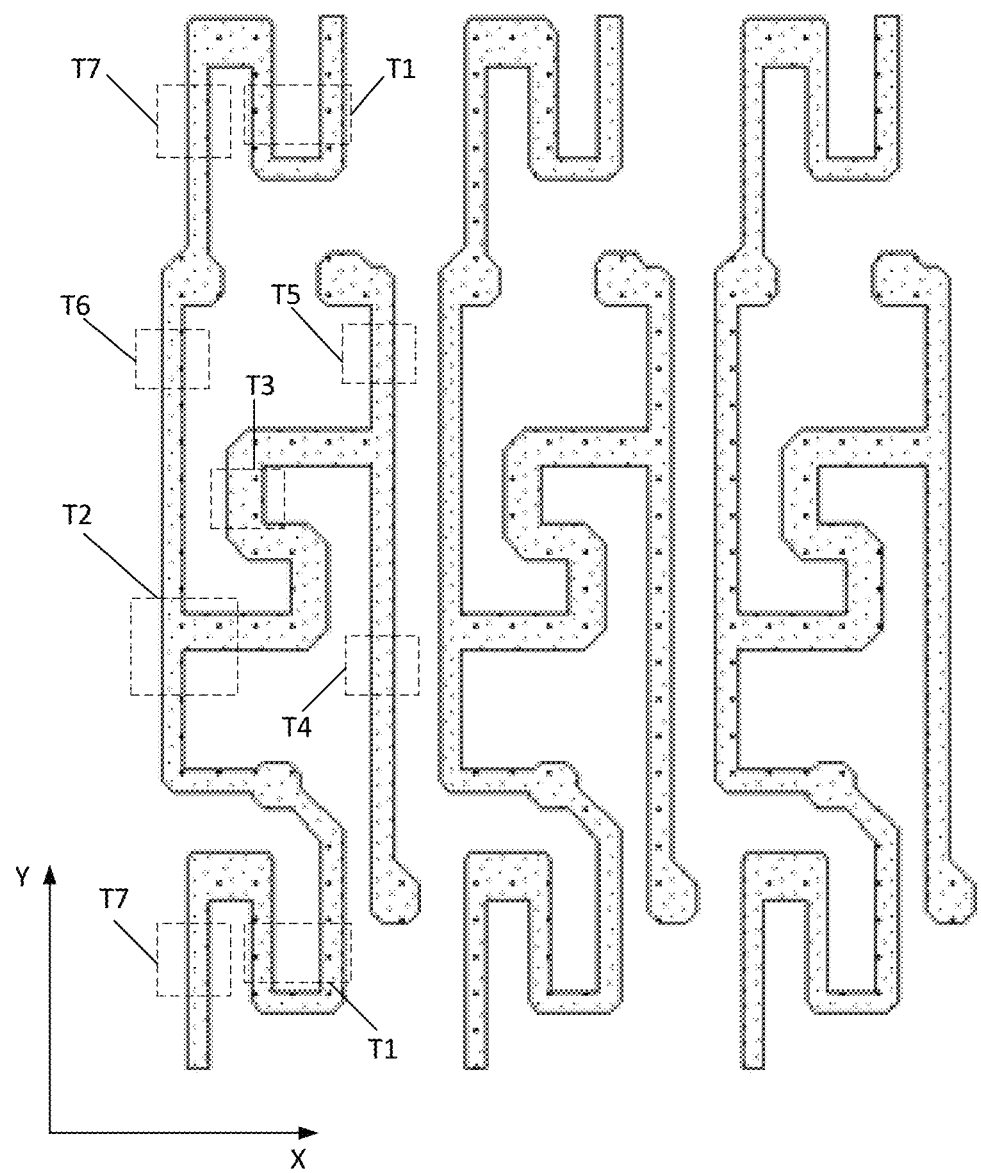
FIG. 6 is a schematic diagram of an active semiconductor layer of a display substrate according to an embodiment of the present disclosure.

For example, FIG. 6 is a schematic view of an active semiconductor layer of a display substrate according to an embodiment of the present disclosure; as shown in FIG. 6, the active semiconductor layer may be formed by patterning a semiconductor material. The active semiconductor layer may be used to fabricate active layers of the driving transistor T3, the data writing transistor T4, the threshold compensation transistor T2, the first light emitting control transistor T5, the second light emitting control transistor T6, the first reset transistor T1, and the second reset transistor T7 described above. The active semiconductor layer includes an active layer pattern (a channel region) and a doping region pattern (a source doping region and a drain doping region) of each transistor of each sub-pixel, and the active layer pattern and the doping region pattern of each transistor in the same pixel circuit are integrally provided.

Note that the active semiconductor layer is provided on the base 101, a buffer layer 102 is formed between the base 101 and the active semiconductor layer, the active semiconductor layer may include a low-temperature polysilicon layer which is integrally formed, and a source region and a drain region may be transformed to be conductive by doping or the like, to electrically couple the respective structures. That is, the active semiconductor layer of each transistor of each sub-pixel 10 is an entire pattern formed of p-silicon, and each transistor in the same pixel circuit includes a doping region pattern (i.e., the source region and the drain region) and an active layer pattern, with active layers of different transistors being separated by a doped structure.

For example, the active semiconductor layer may be made of amorphous silicon, polycrystalline silicon, an oxide semiconductor material, or the like. The source region and the drain region may be regions doped with n-type impurities or p-type impurities.

For example, active semiconductor layers in pixel circuits of the sub-pixels 10 of different colors arranged along the first direction X are decoupled from each other. Active semiconductor layers in pixel circuits of the sub-pixels 10 arranged along the second direction Y may be integrally provided or may be decoupled from each other.

FIG. 4 further shows the scan signal line Ga (including the first scan signal line Ga1 and the second scan signal line Ga2), the reset control signal line Rst (including the first reset control signal line Rst1 and the second reset control signal line Rst2), the reset power signal line Init of the reset power terminal Vinit (including the first reset power signal line Init1 of the first reset power terminal Vinit1 and the second reset power signal line Init2 of the second reset power terminal Vinit2), the light emitting control signal line EM (including the first light emitting control signal line EM1 and the second light emitting control signal line EM2), the data line Vd, and the power signal line VDD (including a first power signal line VDD1 and a second power signal line VDD2) which are electrically coupled to the pixel circuit 0121 of the sub-pixel 10 of each color. The first power signal line VDD1 and the second power signal line VDD2 are electrically coupled to each other.

It should be noted that, in the example shown in FIG. 4, the first scan signal line Ga1 and the second scan signal line Ga2 are a same scan signal line Ga, the first reset power signal line Init1 and the second reset power signal line Init2 are a same reset power signal line Init, the first reset control signal line Rst1 and the second reset control signal line Rst2 are a same reset control signal line Rst, and the first light emitting control signal line EM1 and the second light emitting control signal line EM2 are a same light emitting control signal line EM, but the present disclosure is not limited thereto.

Figure 7:
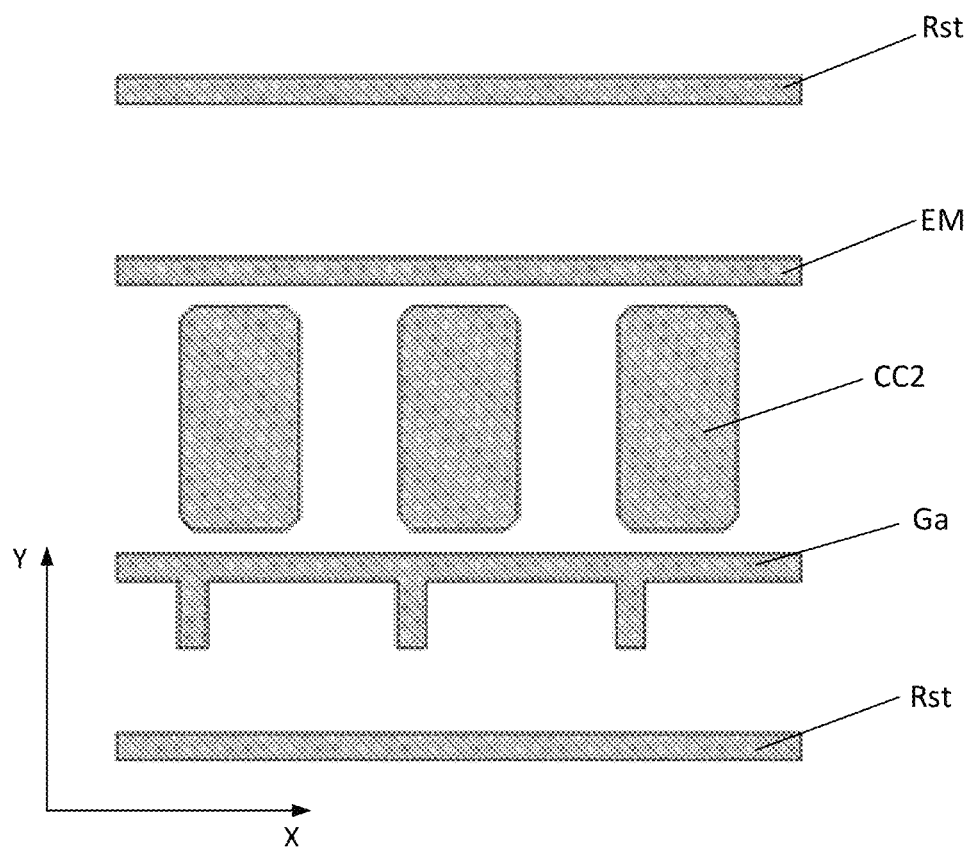
FIG. 7 is a schematic diagram of a first conductive layer of a display substrate according to an embodiment of the present disclosure.

For example, a gate metal layer of the pixel circuit may include a first conductive layer and a second conductive layer. A gate insulation layer 103 is formed on the above active semiconductor layer, the gate insulation layer 103 shown in FIG. 3 is configured to insulate the active semiconductor layer from a gate metal layer to be subsequently formed. FIG. 7 is a schematic diagram of a first conductive layer of a display substrate according to the present disclosure, and as shown in FIG. 7, the display substrate includes a first conductive layer arranged on a side of the gate insulation layer 103 away from the active semiconductor layer, so as to be insulated from the active semiconductor layer. The first conductive layer may include the second electrode plate CC2 of the storage capacitor Cst, the scan signal line Ga, the reset control signal line Rst, the light emitting control signal line EM, and the gates of the driving transistor T3, the data writing transistor T4, the threshold compensation transistor T2, the first light emitting control transistor T5, the second light emitting control transistor T6, the first reset transistor T1, and the second reset transistor T7.

For example, as shown in FIG. 4, the gate of the data writing transistor T4 may be a portion of the scan signal line Ga overlapping with the active semiconductor layer; the gate of the first light emitting control transistor T5 may be a first portion of the light emitting control signal line EM overlapping with the active semiconductor layer, and the gate of the second light emitting control transistor T6 may be a second portion of the light emitting control signal line EM overlapping with the active semiconductor layer; the gate of the first reset transistor T1 may be a first portion of the reset control signal line Rst overlapping with the active semiconductor layer, and the gate of the second reset transistor T7 may be a second portion of the reset control signal line Rst overlapping with the active semiconductor layer; the threshold compensation transistor T2 may be a thin film transistor of a double-gate structure, a first gate of the threshold compensation transistor T2 may be a portion of the scan signal line Ga overlapping with the active semiconductor layer 310, and a second gate of the threshold compensation transistor T2 may be a portion of a protrusion structure P protruding from the scan signal line Ga overlapping with the active semiconductor layer. As shown in FIG. 4, the gate of the driving transistor T3 may be the second electrode plate CC2 of the storage capacitor Cst.

Note that dotted rectangular frames in FIG. 4 show the portions of the first conductive layer overlapping with the active semiconductor layer. As channel regions of the respective transistors, portions of the active semiconductor layer on both sides of each channel region are rendered conductive by an ion doping process or the like to form sources and drains of the respective transistors.

For example, as shown in FIG. 4, the scan signal line Ga, the reset control signal line Rst, and the light emitting control signal line EM are arranged along the second direction Y. The scan signal line Ga is located between the reset control signal line Rst and the light emitting control signal line EM.

For example, in the second direction Y, the second electrode plate CC2 of the storage capacitor Cst (i.e., the gate of the driving transistor T3) is located between the scan signal line Ga and the light emitting control signal line EM. The protrusion structure P projecting from the scan signal line Ga is located on a side of the scan signal line Ga away from the light emitting control signal line EM.

For example, as shown in FIG. 4, in the second direction Y, the gate of the data writing transistor T4 and the gate of the threshold compensation transistor T2 are located at a first side of the gate of the driving transistor T3, and the gates of the first and second reset transistors T1 and T7 and the first and second light emitting control transistors T5 and T6 are located at a second side of the gate of the driving transistor T3. For example, in the example shown in FIG. 4, the first side and the second side of the gate of the driving transistor T3 of the pixel circuit of the sub-pixel 10 are two sides of the gate of the driving transistor T3 opposite to each other in the second direction Y. For example, as shown in FIG. 4, in a XY plane, the first side of the gate of the driving transistor T3 of the pixel circuit of the sub-pixel 10 may be a lower side of the gate of the driving transistor T3, and the second side of the gate of the driving transistor T3 of the pixel circuit of the sub-pixel 10 may be an upper side of the gate of the driving transistor T3. The lower side, for example, the side of the display substrate for binding an integrated circuit (IC) is the lower side of the display substrate, and the lower side of the gate of the driving transistor T3 is a side of the gate of the driving transistor T3 proximal to the IC. The upper side is an opposite side of the lower side, for example, the upper side is a side of the gate of the driving transistor T3 away from the IC.

In some implementations, as shown in FIG. 4, in the first direction X, the gate of the second light emitting control transistor T6, the gate of the second reset transistor T7, and the first gate of the threshold compensation transistor T2 are all located at a third side of the gate of the driving transistor T3; the gate of the first light emitting control transistor T5, the gate of the data writing transistor T4, the gate of the first reset transistor T1 are all located at a fourth side of the gate of the driving transistor T3. For example, in the example shown in FIG. 4, the third and fourth sides of the gate of the driving transistor T3 of the pixel circuit of the sub-pixel 10 are two sides of the gate of the driving transistor T3 opposite to each other in the first direction X. For example, as shown in FIG. 4, the third side of the gate of the driving transistor T3 of the pixel circuit may be a left side of the gate of the driving transistor T3 of the pixel circuit, and the fourth side of the gate of the driving transistor T3 of the pixel circuit may be a right side of the gate of the driving transistor T3 of the pixel circuit. The left and right sides are opposite sides, for example, for the data line Vd and the first power signal line VDD1 coupled to a same pixel circuit, the data line Vd is on the right side of the first power signal line VDD1, and the first power signal line VDD1 is on the left side of the data line Vd.

Figure 9:
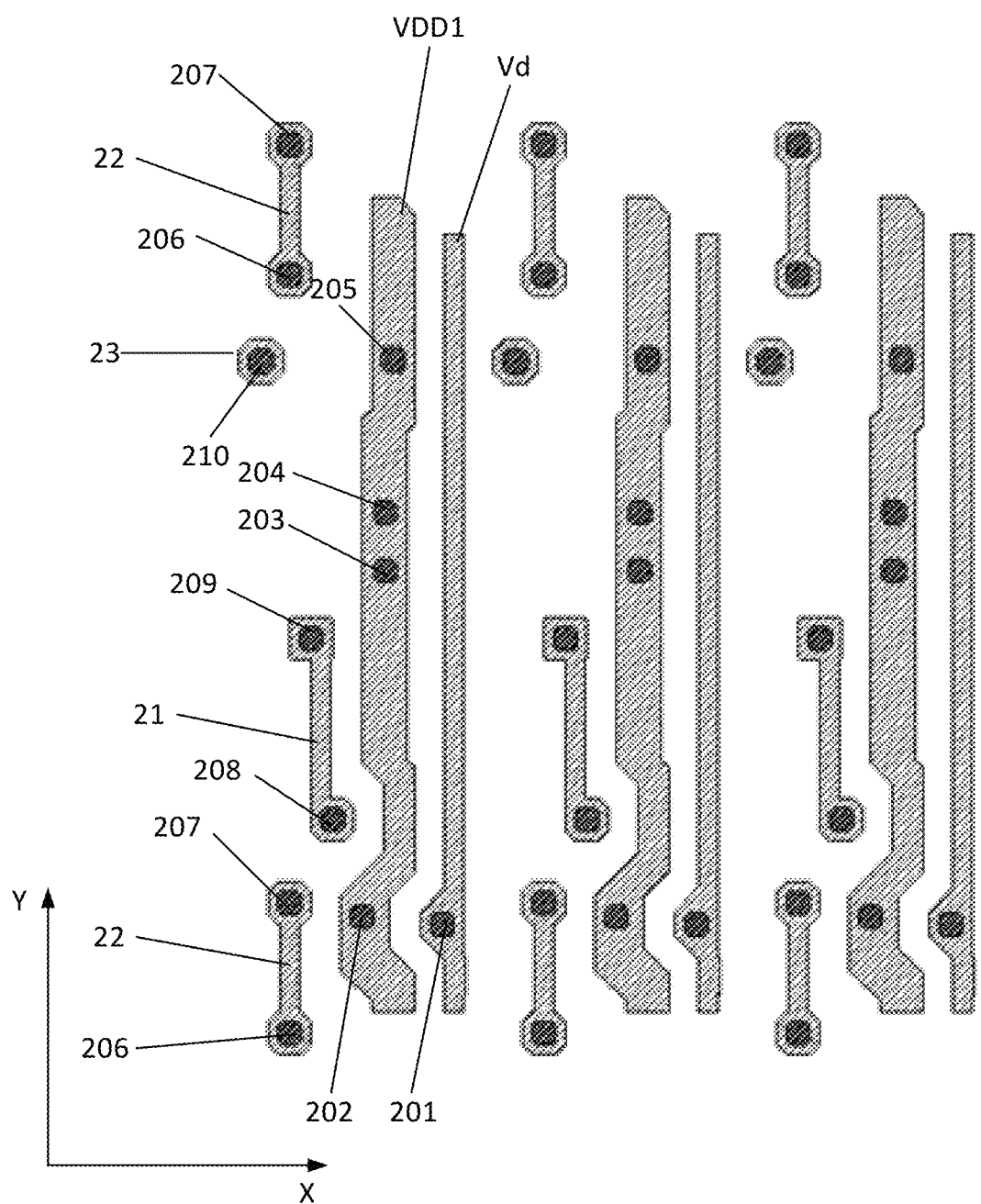
FIG. 9 is a schematic diagram of a source-drain metal layer of a display substrate according to an embodiment of the present disclosure.
Figure 10:
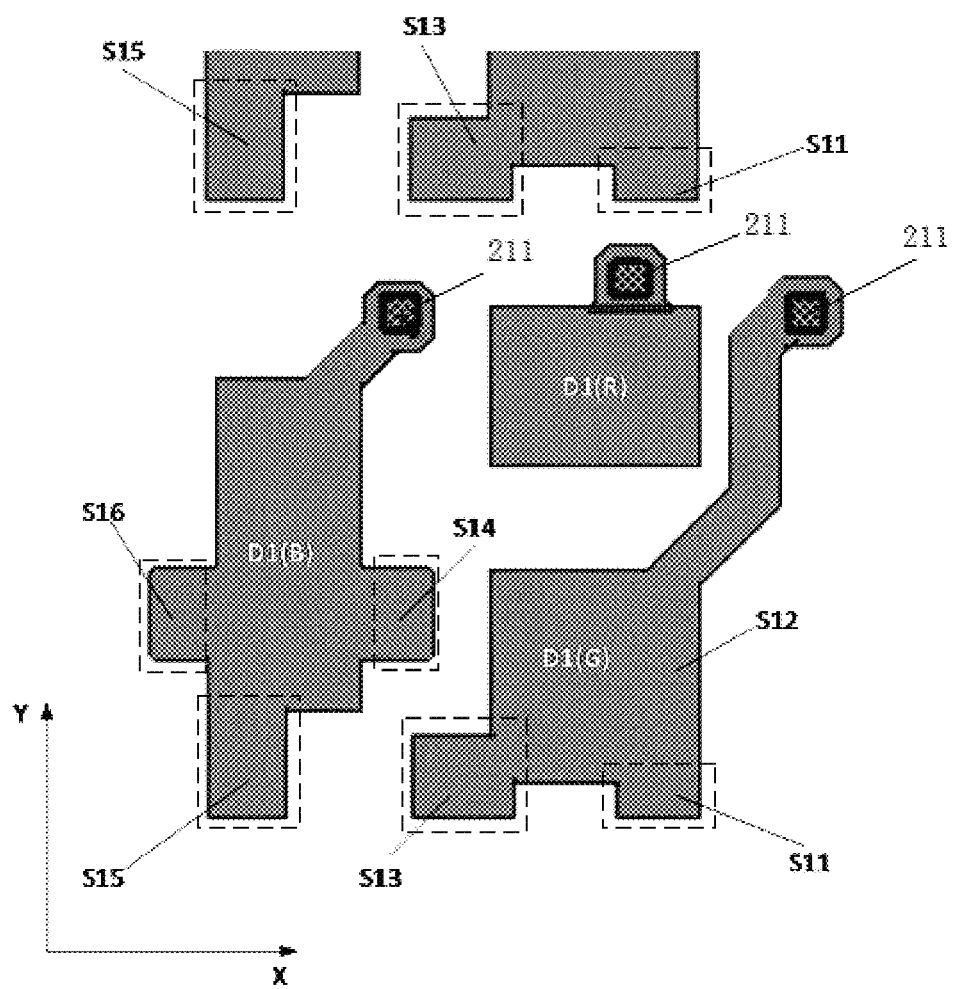
FIG. 10 is a schematic diagram of a first electrode of a light emitting device and a first light-blocking pattern of a display substrate according to an embodiment of the present disclosure.

Note that the structure of each pixel circuit may be a mirror image structure as shown in FIGS. 9A to 10, that is, the structures of the layers of each pixel circuit may be reversed with respect to the channel region of the driving transistor T3, and therefore, the left side and the right side described above may be reversed.

For example, a first insulation layer 104 is formed on the first conductive layer (the first insulation layer 104 shown in FIG. 3) for insulating the first conductive layer from second conductive layer to be subsequently formed. FIG. 8 is a schematic diagram of a second conductive layer of a display substrate according to an embodiment of the present disclosure, as shown in FIG. 8, the second conductive layer of the pixel circuit includes the first electrode plate CC1 of the storage capacitor Cst, the reset power signal line Init, the second power signal line VDD2, and a second light-blocking pattern S20. The second power signal line VDD2 may be integrally formed with the first electrode plate CC1 of the storage capacitor Cst, a plurality of first power signal lines VDD1 (described later) extending in a Y direction are coupled by the first electrode plate CC1 of the storage capacitor Cst and the second power signal line VDD2, so as to form a grid wiring and reduce the resistance. The first electrode plate CC1 of the storage capacitor Cst at least partially overlaps the second electrode plate CC2 of the storage capacitor Cst to form the storage capacitor Cst.

In some implementations, as shown in FIG. 8, a portion of the active semiconductor layer between two channel regions of the double-gate threshold compensation transistor T2 is in a floating state when the threshold compensation transistor T2 is turned off, and is easy to jump due to influence of voltages of surrounding lines, so that the leakage current of the threshold compensation transistor T2 is affected, and the emission brightness is affected. In order to keep the voltage of the portion of the active semiconductor layer between the two channel regions of the threshold compensation transistor T2 stable, the second light-blocking pattern S20 is provided to form a capacitance with the portion of the active semiconductor layer between the two channel regions of the threshold compensation transistor T2, and the second light-blocking pattern S20 may be coupled to the first power signal line VDD1 to obtain a constant voltage, so that the voltage of the portion of the active semiconductor layer in the floating state can be kept stable. The second light-blocking pattern S20 overlaps the portion of the active semiconductor layer between the two channel regions of the double-gate threshold compensation transistor T2, and can also prevent the portion of the active semiconductor layer between the two gates of the double-gate threshold compensation transistor T2 from being illuminated to cause changes of characteristics thereof, for example, prevent the voltage of the portion of the active semiconductor layer from being changed, and thus prevent crosstalk from occurring.

In an implementation, as shown in FIG. 4, the first power signal line VDD1 to which each second light-blocking pattern S20 is coupled is one of the plurality of first power signal lines VDD1 that is closest to said each second light-blocking pattern S20 in the first direction X. For example, as shown in FIG. 4, the second light-blocking pattern S20 for blocking the channel region of the threshold compensation transistor T2 in the second pixel circuit is coupled to the first power signal line VDD1 on the left side thereof, and the first power signal line VDD1 is also used to supply the first voltage to the first pixel circuit.

For example, a second insulation layer 105 (such as the second insulation layer 105 shown in FIG. 3) is formed on the second conductive layer to insulate the second conductive layer from a source-drain metal layer to be formed later. FIG. 9 is a schematic diagram of a source-drain metal layer of a display substrate according to an embodiment of the present disclosure, and as shown in FIG. 9, the source-drain metal layer of the pixel circuit includes the data line Vd and the first power signal line VDD1. The data line Vd and the first power signal line VDD1 extend in the Y direction.

For example, the source-drain metal layer further includes a first connection portion 21, a second connection portion 22, and a third connection portion 23. FIG. 9 further shows exemplary locations of a plurality of vias through which the source-drain metal layer is coupled to a plurality of film layers between the source-drain metal layer and the base 101. For example, as shown in FIGS. 3 and 9, the data line Vd is electrically coupled to the drain of the data writing transistor T4 through a via 201 penetrating through the gate insulation layer 103, the first insulation layer 104, and the second insulation layer 105. The first power signal line VDD1 is electrically coupled to the source of the first light emitting control transistor T5 through a via 205 penetrating through the gate insulation layer 103, the first insulation layer 104, and the second insulation layer 105. The first power signal lines VDD1 and the data lines Vd are alternately arranged in the first direction X. The first power signal line VDD1 is electrically coupled to the second power signal line VDD2 (the first electrode plate CC1 of the storage capacitor) through vias 203 and 204 penetrating through the second insulation layer 105. The first power signal line VDD1 extends in the second direction Y, and the second power signal line VDD2 extends in the first direction X. The first power signal lines VDD1 and the second power signal lines VDD2 are arranged in a grid on the display substrate. That is, the first power signal lines VDD1 and the second power signal lines VDD2 are arranged in a grid pattern on the entire display substrate, so that the resistance of the signal lines of the power terminal VDD is relatively small, a voltage drop across the signal lines is relatively low, and stability and uniformity of the power voltage supplied by the power terminal VDD can be improved. The first power signal line VDD1 is electrically coupled with the second light-blocking pattern S20 through a via 202 penetrating through the second insulation layer 105 to supply a constant voltage to the second light-blocking pattern S20. One end of the first connection portion 21 is electrically coupled to the drain of the threshold compensation transistor T2 through a via 208 penetrating through the gate insulation layer 103, the first insulation layer 104, and the second insulation layer 105, and the other end of the first connection portion 21 is electrically coupled to the gate of the driving transistor T3 (i.e., the second electrode plate CC2 of the storage capacitor Cst) through a via 209 penetrating through the first insulation layer 104 and the second insulation layer 105. One end of the second connection portion 22 is electrically coupled to the reset power signal line Init through a via 206 penetrating through the second insulation layer 105, and the other end of the second connection portion 22 is electrically coupled to the source of the second reset transistor T7 through a via 207 penetrating through the gate insulation layer 103, the first insulation layer 104, and the second insulation layer 105. The third connection part 23 includes a first portion and a second portion, and the first portion of the third connection part 23 is electrically coupled to the drain of the second light emitting control transistor T6 through a via 210 penetrating through the gate insulation layer 103, the first insulation layer 104 and the second insulation layer 105.

For example, a planarization layer 106 (the planarization layer 106 as shown in FIG. 3) is formed on the source-drain metal layer to protect the source-drain metal layer. The first electrode D1 of the light emitting device D is formed on the planarization layer 106; FIG. 10 is a schematic diagram of the first electrode D1 and the first light-blocking pattern of the light emitting device D of the display substrate according to the embodiment of the present disclosure, as shown in FIG. 10, the planarization layer 106 includes a via 211, the first electrode D1 of the light emitting device D of each sub-pixel 10 may be disposed on a side of the planarization layer 106 away from the base, and the first electrode D1 of the light emitting device D is electrically coupled with the second portion of the third connection portion 23 through the via 211 so as to be electrically coupled with the drain of the second light emitting control transistor T6.

In some implementations, the light emitting device D may be an organic light emitting diode (OLED), or may also be a diode (LED), and in the embodiment of the present disclosure, the light emitting device D being the organic light emitting diode (OLED) is illustrated. One of the first electrode and the second electrode of the light emitting device D is an anode, and the other of the first electrode and the second electrode of the light emitting device D is a cathode. In the following description, for convenience of description, a case where the first electrode of the light emitting device D is the anode and the second electrode of the light emitting device D is the cathode is taken as an example for illustrating. It should be understood that the first light-blocking pattern is disposed in the same layer and is made of the same material as the anode, and in such case, the material of the anode should be an opaque conductive material. A specific structure of the anode includes but is not limited to the structure formed by three layers of metal materials of Ag/Al/Ag.

In some implementations, the first electrodes D1 of the light emitting devices D have different sizes according to the emission colors of the light emitting devices D. Referring to FIG. 10, for each pixel unit 100, anodes of the light emitting devices D of the red, green, and blue sub-pixels R, G, and B are in a shape of an inverted Chinese character "品", where the anode D1(R) of the light emitting device D of the red sub-pixel 10 and the anode D1(B) of the light emitting device D of the blue sub-pixel B are arranged along the second direction Y, the anode D1(G) of the light emitting device D of the green sub-pixel G is located at a left side of the anode D1(R) of the light emitting device D of the red sub-pixel 10 and the anode D1(B) of the light emitting device D of the blue sub-pixel B, and the anode D1(G) of the light emitting device D of the green sub-pixel G occupies an area substantially identical to those of the anode D1(R) of the light emitting device D of the red sub-pixel 10 and the anode D1(B) of the light emitting device D of the blue sub-pixel B.

In some implementations, FIG. 5 is a layout of a display substrate including the first light-blocking pattern, as shown in FIG. 5, the first light-blocking pattern includes a first light-blocking portion S11, a second light-blocking portion S12, a third light-blocking portion S13, a fourth light-blocking portion S14, a fifth light-blocking portion S15, and a sixth light-blocking portion S16 in each pixel unit 100; where, an orthographic projection of the first-blocking portion S11 on the base 101 covers an orthographic projection of the channel region of the first reset transistor T1 in the red sub-pixel 10 on the base 101; an orthographic projection of the second light-blocking portion S12 on the base 101 covers an orthographic projection of the channel region of the threshold compensation transistor T2 in the red sub pixel 10 on the base 101; an orthographic projection of the third light-blocking portion S13 on the base 101 covers an orthographic projection of the channel region of the first reset transistor T1 in the green sub-pixel G on the base 101, and an orthographic projection of the fourth light-blocking portion S14 on the base 101 covers an orthographic projection of the channel region of the threshold compensation transistor T2 in the green sub-pixel G on the base 101; an orthographic projection of the fifth light-blocking portion S15 on the base 101 covers an orthographic projection of the channel region of the first reset transistor T1 in the blue sub-pixel B on the base 101; an orthogonal projection of the sixth light-blocking portion S16 on the base 101 covers an orthogonal projection of the channel region of the threshold value compensation transistor T2 in the blue sub-pixel B on the base 101. Since the first reset transistor T1 and the threshold compensation transistor T2 in each pixel circuit are double-gate transistors, the first light-blocking portion S11, the second light-blocking portion S12, the third light-blocking portion S13, the fourth light-blocking portion S14, the fifth light-blocking portion S15, and the sixth light-blocking portion S16 are provided in the embodiment of the present disclosure, so that the portion of the active semiconductor layer between the two gates is prevented from being illuminated with light to cause changes of characteristics thereof, for example, the voltage of the portion of the active semiconductor layer is prevented from being changed so as to prevent crosstalk from occurring.

In an implementation, the first light-blocking portion S11, the second light-blocking portion S12, the third light-blocking portion S13, the fourth light-blocking portion S14, the fifth light-blocking portion S15, and the sixth light-blocking portion S16 are disposed in the same layer as the first electrode D1 of the light emitting device D. That is, the first electrode D1 of the light emitting device D, the first light-blocking portion S11, the second light-blocking portion S12, the third light-blocking portion S13, the fourth light-blocking portion S14, the fifth light-blocking portion S15, and the sixth light-blocking portion S16 may be formed by a single process, and thus, the number of the process steps is not increased.

Referring to FIG. 10, in some implementations, the anode D1(B) of the light emitting device D of the blue sub-pixel B in the pixel unit 100 of $i^{th}$ row and $j^{th}$ column is integrated with the second light-blocking portion S12 of the pixel unit 100, and the first light-blocking portion S11 and the third light-blocking portion S13 in the pixel unit 100 of $i^{th}$ row and $(j+1)^{th}$ column. The anode D1(B) of the light-emitting device D of the green sub-pixel G in the pixel unit 100 of $i^{th}$ row and $j^{th}$ column is integrated with the fourth light-blocking portion S14 and the sixth light-blocking portion S16 of the pixel unit 100 and the fifth light-blocking portion S15 in the pixel unit 100 of $i^{th}$ row and $(j+1)^{th}$ column, where i ranges from 1 to N, and N is the number of the pixel units 100 in each column; j ranges from 1 to M, and M is the number of pixel units 100 in each row. By forming a capacitance between the first light-blocking pattern and the portion of the active semiconductor layer between two channel regions of the double-gate transistor, the first light-blocking pattern is coupled to the first electrode D1 to obtain a constant voltage, so that the voltage of the portion of the active semiconductor layer being in the floating state may be kept stable, and the portion of the active semiconductor layer between the two gates can be prevented from being illuminated to cause changes of characteristics thereof, for example, the voltage of the portion of the active semiconductor layer may be prevented from being changed, so as to prevent crosstalk from occurring.

For example, a pixel defining layer 107 is formed on a layer where the first electrode D1 of the light emitting device D is located, the pixel defining layer 107 having an opening formed therein; an orthogonal projection of the opening of the pixel defining layer 107 on the base 101 is located within an orthogonal projection of the corresponding first electrode D1 on the base 101.

For example, the orthogonal projection of the opening of the pixel defining layer 107 on the base 101 is located within an orthogonal projection of a corresponding light emitting layer D2 on the base 101, i.e., the light emitting layer D2 covers the opening of the pixel defining layer 107. For example, an area of the light emitting layer D2 is larger than that of the opening of corresponding pixel defining layer 107, that is, the light emitting layer D2 includes at least a portion covering a physical structure of the pixel defining layer 107 in addition to a portion located inside the opening of the pixel defining layer 107, and generally, the light emitting layer D2 covers the physical structure of the pixel defining layer 107 at each boundary of the opening of the pixel defining layer 107. It should be noted that, the above description of the pattern of the light emitting layer D2 is based on that the organic light emitting layer D2 of each sub-pixel 10 is formed by patterning through, for example, a Fine Metal Mask (FMM) process, and besides the FMM process, some of the light emitting layers D2 are film layers formed integrally in the entire display area through an open mask process, orthographic projections of which on the base 101 are continuous, so that the light emitting layer D2 necessarily includes the portion located in the opening of the pixel defining layer 107 and the portion located on the physical structure of the pixel defining layer 107.

For example, a second electrode D3 of each light emitting device D is formed on the base 101 formed with the light emitting layer D2 of each light emitting device D, where if the first electrode D1 of the light emitting device D is the anode, then the second electrode D3 is the cathode. The cathode may be a planar structure, that is, the cathodes of the plurality of light emitting devices D arranged in an array is an integral structure.

The structure in which the first light-blocking pattern and the first electrode D1 of the light emitting device D in the display substrate according to the embodiment of the present disclosure are disposed in a same layer is described above. Certainly, the above description is only for some exemplary structures in the display substrate of the embodiment of the present disclosure, and does not constitute a limitation to the protection scope of the present disclosure, and it should be understood that it is within the protection scope of the present disclosure as long as the first light-blocking pattern is disposed in the same layer as the first electrode D1 of the light emitting device D to block the channel regions of the first reset transistor T1 and the threshold compensation transistor T2 in each pixel circuit.

Figure 11:
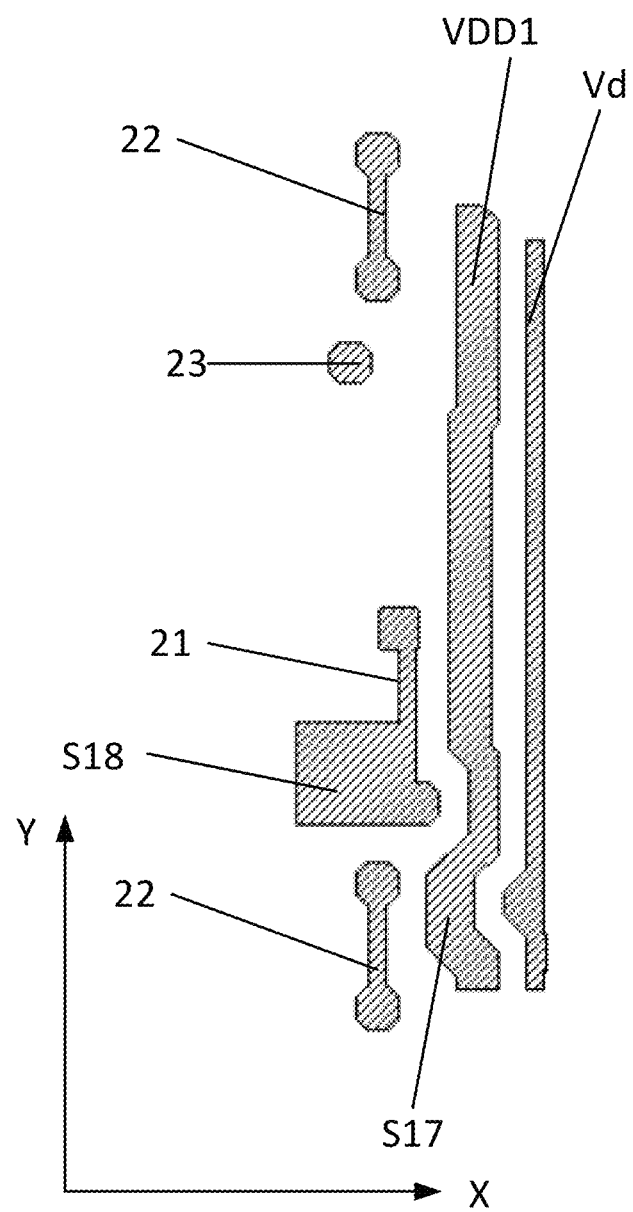
FIG. 11 is a schematic diagram of a source-drain metal layer of a display substrate according to an embodiment of the present disclosure.

FIG. 11 is a schematic diagram of the source-drain metal layer of the display substrate according to an embodiment of the present disclosure, and as shown in FIG. 11, a display substrate is further provided in an embodiment of the present disclosure, and the display substrate has substantially the same structure as the above display substrate, except that the first light-blocking pattern in the display substrate in the present embodiment is located in the source-drain metal layer, that is, the source-drain metal layer of the display substrate includes not only the data line Vd extending along the second direction Y, the first power signal line VDD1 extending along the second direction Y, the first connection portion 21, the second connection portion 22, and the third connection portion 23, but also the first light-blocking pattern.

For example, the first light-blocking pattern includes a seventh light-blocking portion S17 and an eighth light-blocking portion S18 in each sub-pixel 10. An orthographic projection of the seventh light-blocking portion S17 on the base 101 covers the orthographic projection of the channel region of the first reset transistor T1 on the base 101.

An orthographic projection of the eighth light-blocking portion S18 on the base 101 covers the orthographic projection of the channel region of the threshold compensation transistor T2 on the base 101.

In some implementations, the seventh light-blocking portion S17 in each sub-pixel 10 is of an integral structure with the first power signal line VDD1 to which the sub-pixel 10 is coupled. In some implementations, since one end of the second connection portion 22 is electrically coupled to the reset power signal line Init through the via 406 penetrating through the second insulation layer 105, the other end of the second connection portion 22 is electrically coupled to the source of the second reset transistor T7 through the via 207 penetrating through the gate insulation layer 103, the first insulation layer 104, and the second insulation layer 105. The eighth light-blocking portion in each sub-pixel 10 is integrated with the second connection portion 22 in the present sub-pixel 10; that is, the reset power signal Vinit written into the reset power signal line Init is set as a constant voltage signal of the eighth light-blocking portion S18. In such case, the seventh light-blocking portion S17 and the eighth light-blocking portion S18 are supplied with constant voltages through the first power signal line VDD1 and the reset power signal line Init, respectively, and thus the voltage of the active semiconductor layer in the floating state can be kept stable, and the portions of the active semiconductor layer between the gates of the first reset transistor T1 and the gates of the threshold compensation transistor T2 are prevented from being irradiated with light to cause changes of characteristics thereof, for example, the voltages of the portions of the active semiconductor layers are prevented from being changed to prevent crosstalk from occurring.

It should be noted that the reason why the seventh light-blocking portion S17 in each sub-pixel 10 is integrated with the first power signal line VDD1 coupled to the sub-pixel 10 is that, in some implementations, the data lines Vd extending along the second direction Y and the first power signal lines VDD1 extending along the second direction Y may be alternately arranged, and the data line Vd and the first power signal line VDD1 coupled to a same column of sub-pixels 10 are located on the same side of the respective sub-pixels 10 (which are arranged on the right side of the sub-pixels 10 in FIG. 4), while the first power signal line VDD1 is located between the sub-pixel 10 coupled thereto and the data line, so that the seventh light-blocking portion S17 in each sub-pixel 10 and the first power signal line VDD1 coupled to the sub-pixel 10 are integrated, therefore, the problem of short circuit between the seventh light-blocking portion S17 and the data line can be avoided.

Other structures of the display substrate having such a structure may be the same as those of the display substrate described above, and thus, will not be described in detail herein.

In a second aspect, an embodiment of the present disclosure further provides a display device, which includes the above display substrate. It should be noted that, the display device provided in this embodiment may be any product or component with a display function, such as a flexible wearable device, a mobile phone, a tablet computer, a television, a display, a notebook computer, a digital photo frame, a navigator and the like. Those skilled in the art should understand that other essential components of the display device should have, but are not described herein or should not be construed as limiting the disclosure.

Further, the display device may further include various types of display devices, such as a liquid crystal display device, an organic light emitting diode (OLED) display device, and a Mini diode (Mini LED) display device, which are not limited herein.

It will be understood that the above embodiments are merely exemplary embodiments adopted to illustrate the principles of the present disclosure, and the present disclosure is not limited thereto. It will be apparent to those skilled in the art that various modifications and improvements may be made without departing from the spirit and scope of the present disclosure, and such modifications and improvements are also considered to be within the scope of the present disclosure.

The invention claimed is:

1. A display substrate, comprising:
   a base;
   a plurality of pixel units, which are arranged in a plurality of rows along a first direction and a plurality of columns along a second direction and are arranged on the base, and each of the pixel units comprises a plurality of sub-pixels; each of the plurality of sub-pixels comprises a pixel circuit;
   an active semiconductor layer, which comprises a channel region, a source doping region and a drain doping region of each of transistors in each pixel circuit, the pixel circuit at least comprises a driving transistor, a data writing transistor, a storage capacitor, a threshold compensation transistor, a first reset transistor and a light-emitting device; and
   a first light-blocking pattern arranged on a side of the active semiconductor layer away from the base, and an orthographic projection of the first light-blocking pattern on the base covers orthographic projections of channel regions of the first reset transistor and the threshold compensation transistor on the base.

2. The display substrate according to claim 1, wherein each pixel circuit further comprises a second reset transistor, a first light emitting control transistor, and a second light emitting control transistor;
   for the sub-pixels located in a same row, the first reset transistor and the second reset transistor in each pixel circuit are located substantially on a straight line extending in the first direction; the first light emitting control transistor and the second light emitting control transistor in each pixel circuit are located substantially on a straight line extending in the first direction, and the threshold compensation transistor and the data writing transistor in each pixel circuit are located substantially on a straight line extending in the first direction;
   for the sub-pixels located in a same column, the second reset transistor, the second light emitting control transistor, and the threshold compensation transistor in each pixel circuit are located substantially on a straight line extending in the second direction; the first reset transistor, the first light emitting control transistor, and the data writing transistor in each pixel circuit are located substantially on a straight line extending in the second direction.

3. The display substrate according to claim 2, wherein a control electrode of the driving transistor comprises a first side and a second side oppositely arranged along the second direction; for the pixel circuit of each of the sub-pixels, the first reset transistor, the second reset transistor, the first light emitting control transistor, and the second light emitting control transistor are located at the first side; the threshold compensation transistor and the data write transistor are located on the second side.

4. The display substrate according to claim 3, wherein the light-emitting device in each pixel circuit comprises a first electrode, a light-emitting layer, and a second electrode, which are arranged in this order on a side of transistors in each pixel circuit away from the base; the first light-blocking pattern and a first electrode of the light-emitting device are arranged in a same layer and are made of a same material.

5. The display substrate according to claim 4, wherein the plurality of sub-pixels in each pixel unit comprise a first color sub-pixel, a second color sub-pixel, and a third color sub-pixel; the first light-blocking pattern comprises a first light-blocking portion, a second light-blocking portion, a third light-blocking portion, a fourth light-blocking portion, a fifth light-blocking portion and a sixth light-blocking portion in each sub-pixel;
   an orthographic projection of the first light-blocking portion on the base covers an orthographic projection of the channel region of the first reset transistor in the first color sub-pixel on the base; an orthographic projection of the second light-blocking portion on the base covers an orthographic projection of the channel region of the threshold compensation transistor in the first color sub-pixel on the base; an orthographic projection of the third light-blocking portion on the base covers an orthographic projection of the channel region of the first reset transistor in the second color sub-pixel on the base; an orthographic projection of the fourth light-blocking portion on the base covers an orthographic projection of the channel region of the threshold compensation transistor in the second color sub-pixel on the base; an orthographic projection of the fifth light-blocking portion on the base covers an orthographic projection of the channel region of the first reset transistor in the third color sub-pixel on the base; and an orthographic projection of the sixth light-blocking portion on the base covers an orthographic projection of the channel region of the threshold compensation transistor in the third color sub-pixel on the base.

6. The display substrate according to claim 5, wherein for the pixel units located in a same column, first electrodes of light emitting devices in pixel circuits of second color sub-pixels are substantially located on a straight line extending in the second direction; first electrodes of light emitting devices in pixel circuits of the first color sub-pixel and the second color sub-pixel are located substantially on a straight line extending in the second direction;
   the first electrode of the light-emitting device of the third color sub-pixel in the pixel unit in $i^{th}$ row and $j^{th}$ column is in an integral structure with the second light-blocking portion of the present pixel unit, and the first light-blocking portion and the third light-blocking portion in the pixel unit in $i^{th}$ row and $(j+1)^{th}$ column;
   the first electrode of the light-emitting device of the second color sub-pixel in the pixel unit in $i^{th}$ row and $j^{th}$ column is in an integral structure with the fourth light-blocking portion and the sixth light-blocking portion of the present pixel unit, and the fifth light-blocking portion in the pixel unit in $i^{th}$ row and $(j+1)^{th}$ column; where i ranges from 1 to N, and N is the number of the pixel units in each row; j ranges from 1 to M, and M is the number of the pixel units in each row.

7. The display substrate according to claim 6, further comprising:
   a gate insulation layer arranged on a side of the active semiconductor layer away from the base;

a first conductive layer arranged on a side of the gate insulation layer away from the active semiconductor layer; the first conductive layer comprises a second electrode plate of the storage capacitor, a scan signal line extending in the first direction, a reset control signal line extending in the first direction, a light emitting control signal line extending in the first direction, and control electrodes of the driving transistor, the data writing transistor, the threshold compensation transistor, the first light emitting control transistor, the second light emitting control transistor, the first reset transistor, the second reset transistor, and the control electrode of the driving transistor is multiplexed as the second electrode plate of the storage capacitor;

a first insulation layer arranged on a side of the first conductive layer away from the gate insulation layer;

a second conductive layer arranged on a side of the first insulation layer away from the first conductive layer; the second conductive layer comprises a reset power signal line extending in the first direction and a first electrode plate of the storage capacitor;

a second insulation layer arranged on a side of the second conductive layer away from the first insulation layer;

a source-drain metal layer arranged on a side of the second insulation layer away from the second conductive layer; the source-drain metal layer comprises a power signal line extending along the second direction, a data line extending along the second direction, a first connection portion, a second connection portion and a third connection portion;

a planarization layer arranged between the source-drain metal layer and the first electrode of the light-emitting device;

the first connection portion is configured to couple a second electrode of the threshold compensation transistor and a control electrode of the driving transistor, the second connection portion is configured to couple the reset power signal line with a first electrode of the second reset transistor, and the third connection portion is configured to couple a first electrode of the light emitting device with a second electrode of the second light emitting control transistor;

the third connection portion comprises a first portion electrically coupled to the second electrode of the second light emitting control transistor through a via penetrating through the gate insulation layer, the first insulation layer and the second insulation layer, and a second portion electrically coupled to the first electrode of the light emitting device through a via penetrating through the planarization layer.

8. The display substrate according to claim 7, wherein the second conductive layer further comprises a second light-blocking pattern provided in each of the sub-pixels; an orthographic projection of the second light-blocking pattern in each sub-pixel on the base covers an orthographic projection of the channel region of the threshold compensation transistor of the pixel circuit in the present sub-pixel, and the second light-blocking pattern is electrically coupled with a first power signal line.

9. The display substrate according to claim 8, wherein the first power signal line to which the second light-blocking pattern is coupled is one of a plurality of first power signal lines closest to the second light-blocking pattern in the first direction.

10. The display substrate according to claim 2, wherein the light-emitting device in each pixel circuit comprises a first electrode, a light-emitting layer, and a second electrode, which are arranged in this order on a side of transistors in each pixel circuit away from the base; the first light-blocking pattern and a first electrode of the light-emitting device are arranged in a same layer and are made of a same material.

11. The display substrate according to claim 2, further comprising:

a gate insulation layer arranged on a side of the active semiconductor layer away from the base;

a first conductive layer arranged on a side of the gate insulation layer away from the active semiconductor layer; the first conductive layer comprises a second electrode plate of the storage capacitor, a scan signal line extending in the first direction, a reset control signal line extending in the first direction, a light emitting control signal line extending in the first direction, and control electrodes of the driving transistor, the data writing transistor, the threshold compensation transistor, the first light emitting control transistor, the second light emitting control transistor, the first reset transistor, and the second reset transistor, and the control electrode of the driving transistor is multiplexed as the second electrode plate of the storage capacitor;

a first insulation layer arranged on a side of the first conductive layer away from the gate insulation layer;

a second conductive layer arranged on a side of the first insulation layer away from the first conductive layer; the second conductive layer comprises a reset power signal line extending in the first direction and a first electrode plate of the storage capacitor;

a second insulation layer arranged on a side of the second conductive layer away from the first insulation layer;

a source-drain metal layer arranged on a side of the second insulation layer away from the second conductive layer; the source-drain metal layer comprises a power signal line extending in the second direction, a data line extending in the second direction, and the first light-blocking pattern.

12. The display substrate according to claim 1, further comprising:

a gate insulation layer arranged on a side of the active semiconductor layer away from the base;

a first conductive layer arranged on a side of the gate insulation layer away from the active semiconductor layer; the first conductive layer comprises a second electrode plate of the storage capacitor, a scan signal line extending in the first direction, a reset control signal line extending in the first direction, a light emitting control signal line extending in the first direction, and control electrodes of the driving transistor, the data writing transistor, the threshold compensation transistor, the first light emitting control transistor, the second light emitting control transistor, the first reset transistor, and the second reset transistor, and the control electrode of the driving transistor is multiplexed as the second electrode plate of the storage capacitor;

a first insulation layer arranged on a side of the first conductive layer away from the gate insulation layer;

a second conductive layer arranged on a side of the first insulation layer away from the first conductive layer; the second conductive layer comprises a reset power signal line extending in the first direction and a first electrode plate of the storage capacitor;

a second insulation layer arranged on a side of the second conductive layer away from the first insulation layer;

a source-drain metal layer arranged on a side of the second insulation layer away from the second conductive layer; the source-drain metal layer comprises a power signal line extending in the second direction, a data line extending in the second direction, and the first light-blocking pattern.

13. The display substrate according to claim 12, wherein the first light-blocking pattern comprises a seventh light-blocking portion and an eighth light-blocking portion in each sub-pixel; an orthographic projection of the seventh light-blocking portion on the base covers an orthographic projection of the channel region of the first reset transistor of the pixel circuit in the sub-pixel where the seventh light-blocking portion is located on the base; an orthographic projection of the eighth light-blocking portion on the base covers an orthographic projection of the channel region of the threshold compensation transistor of the pixel circuit in the sub-pixel where the eighth light-blocking portion is located on the base;
the seventh light-blocking portion and the power signal line coupled with the sub-pixel where the seventh light-blocking portion is located are of an integral structure.

14. The display substrate according to claim 11, further comprising:
a planarization layer arranged between the source-drain metal layer and the first electrode of the light-emitting device;
the source-drain metal layer further comprises: a first connection portion, a second connection portion, and a third connection portion;
the first connection portion is configured to couple a second electrode of the threshold compensation transistor with the control electrode of the driving transistor, the second connection portion is configured to couple the reset power signal line with a first electrode of the second reset transistor, and the third connection portion is configured to couple the first electrode of the light emitting device with a second electrode of the second light emitting control transistor;
the third connection portion comprises a first portion electrically coupled to the second electrode of the second light emitting control transistor through a via penetrating through the gate insulation layer, the first insulation layer and the second insulation layer, and a second portion electrically coupled to the first electrode of the light emitting device through a via penetrating through the planarization layer;
the eighth light-blocking portion and the second connection portion are of an integral structure.

15. The display substrate according to claim 12, wherein the second conductive layer further comprises a second light-blocking pattern provided in each of the sub-pixels; an orthographic projection of the second light-blocking pattern in each sub-pixel on the base covers an orthographic projection of the channel region of the threshold compensation transistor of the pixel circuit in the sub-pixel on the base, and the second light-blocking pattern is electrically coupled with a first power signal line.

16. The display substrate according to claim 15, wherein the first power signal line to which each second light-blocking pattern is coupled is one of a plurality of first power signal lines which is closest to the second light-blocking pattern in the first direction.

17. The display substrate according to claim 1, wherein both the first reset transistor and the threshold compensation transistor are double-gate transistors.

18. A display device, comprising the display substrate of claim 1.

19. The display substrate according to claim 1, wherein the light-emitting device in each pixel circuit comprises a first electrode, a light-emitting layer, and a second electrode, which are arranged in this order on a side of transistors in each pixel circuit away from the base; the first light-blocking pattern and a first electrode of the light-emitting device are arranged in a same layer and are made of a same material.

20. The display substrate according to claim 1, further comprising:
a gate insulation layer arranged on a side of the active semiconductor layer away from the base;
a first conductive layer arranged on a side of the gate insulation layer away from the active semiconductor layer; the first conductive layer comprises a second electrode plate of the storage capacitor, a scan signal line extending in the first direction, a reset control signal line extending in the first direction, a light emitting control signal line extending in the first direction, and control electrodes of the driving transistor, the data writing transistor, the threshold compensation transistor, the first light emitting control transistor, the second light emitting control transistor, the first reset transistor, the second reset transistor, and the control electrode of the driving transistor is multiplexed as the second electrode plate of the storage capacitor;
a first insulation layer arranged on a side of the first conductive layer away from the gate insulation layer;
a second conductive layer arranged on a side of the first insulation layer away from the first conductive layer; the second conductive layer comprises a reset power signal line extending in the first direction and a first electrode plate of the storage capacitor;
a second insulation layer arranged on a side of the second conductive layer away from the first insulation layer;
a source-drain metal layer arranged on a side of the second insulation layer away from the second conductive layer; the source-drain metal layer comprises a power signal line extending along the second direction, a data line extending along the second direction, a first connection portion, a second connection portion and a third connection portion;
a planarization layer arranged between the source-drain metal layer and the first electrode of the light-emitting device;
the first connection portion is configured to couple a second electrode of the threshold compensation transistor and a control electrode of the driving transistor, the second connection portion is configured to couple the reset power signal line with a first electrode of the second reset transistor, and the third connection portion is configured to couple a first electrode of the light emitting device with a second electrode of the second light emitting control transistor;
the third connection portion comprises a first portion electrically coupled to the second electrode of the second light emitting control transistor through a via penetrating through the gate insulation layer, the first insulation layer and the second insulation layer, and a second portion electrically coupled to the first electrode of the light emitting device through a via penetrating through the planarization layer.

* * * * *